United States Patent
Igarashi et al.

(10) Patent No.: US 9,452,478 B2
(45) Date of Patent: Sep. 27, 2016

(54) SURFACE-COATED CUTTING TOOL HAVING THEREIN HARD COATING LAYER CAPABLE OF EXHIBITING EXCELLENT CHIPPING RESISTANCE DURING HIGH-SPEED INTERMITTENT CUTTING WORK

(71) Applicant: MITSUBISHI MATERIALS CORPORATION, Tokyo (JP)

(72) Inventors: Makoto Igarashi, Naka (JP); Sho Tatsuoka, Naka (JP); Naoyuki Iwasaki, Naka (JP); Akira Osada, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 10 days.

(21) Appl. No.: 14/383,333

(22) PCT Filed: Mar. 11, 2013

(86) PCT No.: PCT/JP2013/056639
§ 371 (c)(1),
(2) Date: Feb. 6, 2015

(87) PCT Pub. No.: WO2013/133441
PCT Pub. Date: Sep. 12, 2013

(65) Prior Publication Data
US 2015/0158094 A1 Jun. 11, 2015

(30) Foreign Application Priority Data

Mar. 9, 2012 (JP) .................... 2012-053652
Mar. 6, 2013 (JP) .................... 2013-044706

(51) Int. Cl.
*C23C 16/36* (2006.01)
*B23C 5/00* (2006.01)
(Continued)

(52) U.S. Cl.
CPC ........... *B23C 5/006* (2013.01); *C23C 16/0272* (2013.01); *C23C 16/36* (2013.01);
(Continued)

(58) Field of Classification Search
USPC .......... 51/307, 309; 428/216, 325, 336, 697, 428/698, 699, 701, 702
See application file for complete search history.

(56) References Cited

U.S. PATENT DOCUMENTS 6,238,739 B1 * 5/2001 Madar ............... C23C 16/34
427/255.391
7,767,320 B2 8/2010 Endler
(Continued)

FOREIGN PATENT DOCUMENTS

| CN | 101014435 A | 8/2007 |
|---|---|---|
| CN | 102051577 A | 5/2011 |

(Continued)

OTHER PUBLICATIONS

Lee et al "(Ti(1-x)Al(x)N coatings by plasma enhanced chemical vapor depostion." J. Vac Sci. Techn A 12 (4) (1994) p. 1602-1607.*
(Continued)

*Primary Examiner* — Archene Turner
(74) *Attorney, Agent, or Firm* — Leason Ellis LLP

(57) ABSTRACT

A surface-coated cutting tool includes a body and a hard coating layer coating the cutting tool body. In the surface-coated cutting tool, the $(Ti_{1-X}Al_X)(C_YN_{1-Y})$ layer with a cubic crystal structure (X and Y are atomic ratio, and satisfy $0.60 \leq X \leq 0.90$ and $0.0005 \leq Y \leq 0.005$, respectively) is vapor-deposited on the body by a chemical vapor deposition method. The Al content $X_L$ is $0.55 \leq X_L \leq 0.70$, and the grain size $D_L$ is 0.1 μm or less in the $(Ti_{1-X}Al_X)(C_YN_{1-Y})$ layer near the interface between the body and the complex carbonitride layer. The Al content $X_H$ $0.80 \leq X_H \leq 0.95$ and the average grain size $D_H$ is 0.5 μm to 2 μm in the $(Ti_{1-X}Al_X)(C_YN_{1-Y})$ layer near the outer surface side. Furthermore, the Al content ratio and the grain size in the $(Ti_{1-X}Al_X)(C_YN_{1-Y})$ layer gradually increase to the outer surface side.

12 Claims, 1 Drawing Sheet

(51) Int. Cl.
*C23C 16/02* (2006.01)
*C23C 28/04* (2006.01)
*C23C 16/40* (2006.01)
*C22C 29/04* (2006.01)
*C22C 29/08* (2006.01)
*C22C 26/00* (2006.01)

(52) U.S. Cl.
CPC .......... *C23C 16/403* (2013.01); *C23C 28/042* (2013.01); *C23C 28/044* (2013.01); *B23C 2222/28* (2013.01); *B23C 2224/04* (2013.01); *B23C 2224/22* (2013.01); *B23C 2228/04* (2013.01); *C22C 29/04* (2013.01); *C22C 29/08* (2013.01); *C22C 2026/003* (2013.01); *C22C 2204/00* (2013.01); *Y10T 428/24975* (2015.01); *Y10T 428/265* (2015.01)

(56) References Cited

U.S. PATENT DOCUMENTS

| | | | |
|---|---|---|---|
| 7,785,700 B2* | 8/2010 | Okada | B23B 51/06 428/216 |
| 2003/0108778 A1 | 6/2003 | Okada et al. | |
| 2010/0233511 A1 | 9/2010 | Endler et al. | |
| 2010/0323176 A1 | 12/2010 | Van Den Berg et al. | |

FOREIGN PATENT DOCUMENTS

| | | | |
|---|---|---|---|
| JP | 03-188265 | A | 8/1991 |
| JP | 2001-341008 | * | 12/2001 |
| JP | 2006-037152 | * | 2/2006 |
| JP | 2006-307318 | A | 11/2006 |
| JP | 2011-500964 | A | 1/2011 |
| JP | 2011-516722 | A | 5/2011 |
| JP | 2011-224715 | A | 11/2011 |

OTHER PUBLICATIONS

Kyrylov et al "Coreelation between plasma conditons and properties of (Ti,Al)N coatings by PECVD." Surface & Coatings Techn 151-152 (2002) p. 359-364.*
Office Action mailed Aug. 4, 2015 for the corresponding Chinese Application No. 201380013290.7.
Extended European Search Report mailed Sep. 21, 2015 for the corresponding European Application No. 13758244.1.
Endler et al., "Aluminum-rich TiAlCN coatings by Low Pressure CVD", *Surface & Coatings Technology*, vol. 205, 2010, pp. 1,307-1,312.
International Search Report mailed Apr. 23, 2013 for the corresponding PCT Application No. PCT/JP2013/056639.

* cited by examiner

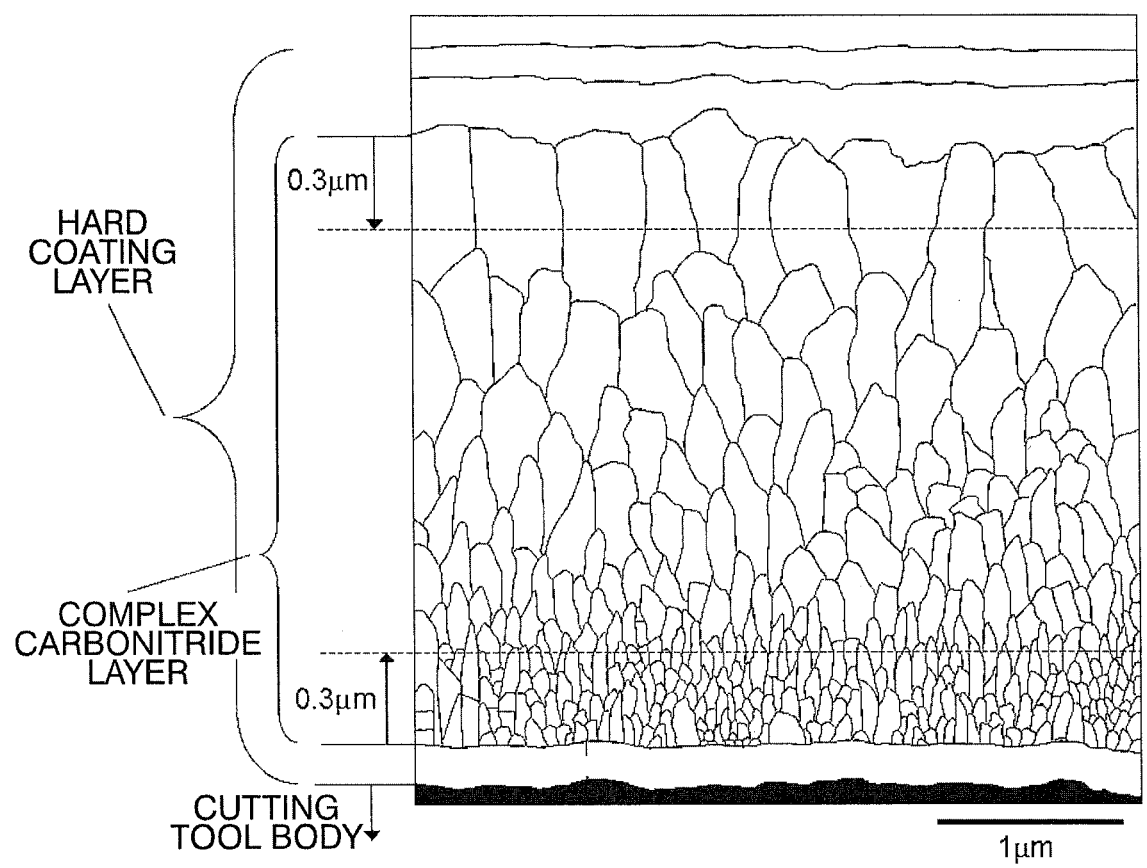

SURFACE-COATED CUTTING TOOL HAVING THEREIN HARD COATING LAYER CAPABLE OF EXHIBITING EXCELLENT CHIPPING RESISTANCE DURING HIGH-SPEED INTERMITTENT CUTTING WORK

CROSS-REFERENCE TO RELATED PATENT APPLICATIONS

This application is a U.S. National Phase Application under 35 U.S.C. §371 of International Patent Application No. PCT/JP2013/056639, filed Mar. 11, 2013, and claims the benefit of Japanese Patent Applications No. 2012-053652, filed Mar. 9, 2012 and No. 2013-44706, filed Mar. 6, 2013, all of which are incorporated by reference in their entirety herein. The International Application was published in Japanese on Sep. 12, 2013 as International Publication No. WO/2013/133441 under PCT Article 21(2).

FIELD OF THE INVENTION

The present invention relates to a surface-coated cutting tool (hereinafter, referred to as a coated cutting tool) whose hard coating layer exhibits excellent chipping resistance during a high-speed intermittent cutting work in which high heat is generated on alloy steel or the like and impacting load is subjected to the cutting edge.

BACKGROUND OF THE INVENTION

Generally, coated cutting tools whose body is made of one of tungsten carbide (hereinafter referred as WC)-based cemented carbide, titanium carbonitride (hereinafter referred as TiCN)-based cermet, and cubic boron nitride-based ultra-high pressure sintered material (hereinafter referred as cBN) are known (hereinafter collectively referred as the body). A Ti—Al-based complex nitride layer is formed by vapor deposition by a physical vapor deposition method on the body as a hard coating layer. Such coated cutting tools exhibit excellent wear resistance.

The above-described coated tools on which the Ti—Al-based complex nitride layer is formed by vapor deposition relatively excel on wear resistance. However, when they are used under a high-speed intermittent cutting condition, unusual tool failures such as chipping or the like tend to take place. Thus, several proposals were made for improving the hard coating layer.

For example, a coated tool is proposed in Patent Literature 1 (PTL 1). In the coated tool disclosed in PTL 1, a hard coating layer made of a complex nitride layer of Ti and Al is formed by vapor deposition on the surface of the body by a physical vapor deposition method. The complex nitride layer of Ti and Al satisfies $0.35 \leq X \leq 0.60$ (X is atomic ratio) when the composition of the complex nitride layer of Ti and Al is expressed by the composition formula, $(Ti_{1-X}Al_X)N$. In addition, the hard coating layer is configured as an alternately stacked structure of a granular crystal structure and a columnar crystal structure of the (Ti, Al)N layer. Because of the configuration explained above, the hard coating layer exhibits excellent chipping resistance, fracturing resistance, and peeling resistance during high-speed intermittent cutting work of high hardness steel.

However, there is a demand for a coated tool with even more improved cutting performance since the Al content ratio X cannot be set 0.6 or higher because the hard coating layer is formed by vapor deposition by a physical vapor deposition method in this coated tool.

From the above-explained viewpoint, a proposal, in which the Al content ratio X is increased to the level about 0.9 by forming the hard coating layer by a chemical vapor deposition method, is made.

For example, formation of a $(Ti_{1-X}Al_X)N$ layer whose Al content ratio X is 0.65-0.95 by vapor deposition by performing chemical vapor deposition in a mixed reaction gas of $TiCl_4$, $AlCl_3$, and $NH_3$ at the temperature range of 650-900° C. is disclosed in Patent Literature 2 (PTL 2). What is intended in PTL 2 is improvement of the heat insulating effect by further coating the $(Ti_{1-X}Al_X)N$ layer by the $Al_2O_3$ layer. Therefore, there is no disclosure about possible effects of forming a $(Ti_{1-X}Al_X)N$ layer with X value increased to 0.65-0.95 on cutting performance.

In addition, for example, formation of a hard coating layer made of a $(Ti_{1-X}Al_X)N$ layer with a cubic crystal structure is described in Patent Literature 3 (PTL 3). The Al content ratio X of the $(Ti_{1-X}Al_X)N$ layer is 0.75-0.93. The hard coating layer is formed by performing chemical vapor deposition in a mixed reaction gas of $TiCl_4$, $AlCl_3$, $NH_3$, and $N_2H_4$ at the temperature range of 700-900° C. without of usage of plasma. However, as in PTL 2, there is no disclosure in PTL 3 about its possible application as a coated tool.

RELATED ART DOCUMENTS

Patent Literature

PTL 1: Japanese Unexamined Patent Application, First Publication No. 2011-224715 (A)

PTL 2: Japanese Unexamined Patent Application, First Publication No. 2011-516722 (A)

PTL 3: U.S. Pat. No. 7,767,320. (B)

Problems to be Solved by the Present Invention

In recently years, the performance of the cutting machines is significantly improved. On the other hand, there are strong demands for labor-saving, energy-saving and reducing cost in the cutting work. In responding to the demands, there is a tendency that the cutting work is performed at a higher speed and a higher efficiency. Thus, even higher unusual tool failures resistance, such as chipping resistance, fracturing resistance, peeling resistance, or the like, is required. At the same time, an excellent wear resistance for a long-term usage is required.

However, in the coated tool described in PTL 1, the Al content ratio cannot be increased since the hard coating layer made of the $(Ti_{1-X}Al_X)N$ layer is formed by vapor deposition by the physical vapor deposition method. Thus, the coated tool in PTL 1 does not have sufficient chipping resistance in the case where it is applied to high-speed intermittent cutting of alloy steel, for example.

In regard to the $(Ti_{1-X}Al_X)N$ layers described in PTLs 2 and 3, which are formed by vapor deposition by the chemical vapor deposition methods, the Al content ratio can be increased, and a cubic crystal structure can be formed. Thus, hard coating layers with a hardness of a certain extent and an excellent wear resistance can be obtained. However, adhesion strength of the hard coating layer with the cutting tool body is not sufficient, and its toughness is inferior in the $(Ti_{1-X}Al_X)N$ layers described in PTLs 2 and 3. Thus, in the case where they are used as a coated tool for high-speed intermittent cutting of alloy steel, unusual tool failures such as chipping, fracturing, peeling, or the like, is likely to occur.

Accordingly, coated tools described in PTLs 2 and 3 does not exhibit a satisfactory cutting performance.

The purpose of the present invention is to provide a coated tool that exhibits: an excellent chipping resistance in the case where it is used in high-speed intermittent cutting of alloy steel or the like; and an excellent wear resistance for a long-term usage.

SUMMARY OF THE INVENTION

Means to Solving the Problems

Under the circumstance described above, the inventors of the present invention conducted an intensive study in order to improve chipping resistance and wear resistance of a coated tool on which a hard coating layer made of complex carbonitride of Ti and Al (referred by "(Ti, Al)(C, N)", or "$(Ti_{1-X}Al_X)(C_YN_{1-Y})$", occasionally) is formed by vapor deposition by chemical vapor deposition. Followings are the findings the inventors made in the study.

Strain due to the difference of the lattice constants of the $(Ti_{1-X}Al_X)(C_YN_{1-Y})$ according to their compositions can be proactively introduced by: forming the $(Ti_{1-X}Al_X)(C_YN_{1-Y})$ layer with a cubic crystal structure by vapor deposition by a thermal chemical deposition method, in which at least trimethylaluminum ($Al(CH_3)_3$) is used as a reaction gas component, on the surface of the cutting tool body made of one of tungsten carbide (hereinafter referred as WC)-based cemented carbide, titanium carbonitride (hereinafter referred as TiCN)-based cermet, and cubic boron nitride nitride-based ultra-high pressure sintered material (hereinafter referred as cBN) as a hard coating layer; and including the compositionally gradient structure in which the Al content ratio in the hard coating layer gradually increases from the side of the interface between the hard coating layer and the body to the outer surface side of the hard coating layer. As a result, chipping resistance of the hard coating layer made of the $(Ti_{1-X}Al_X)(C_YN_{1-Y})$ layer is improved.

The values X and Y are in atomic ratios, and in the upper layer of the $(Ti_{1-X}Al_X)(C_YN_{1-Y})$ layer, they satisfy $0.8 \le X \le 0.95$ and $0.0005 \le Y \le 0.005$, respectively. Therefore, it demonstrates that a cubic-crystal-structured (Ti, Al)(C, N) layer with a high Al content ratio, which cannot be formed by vapor deposition by physical vapor deposition methods, can be formed by vapor deposition by a chemical vapor deposition method in which trimethylaluminum ($Al(CH_3)_3$) is used as a reaction gas component Also, the inventors of the present invention found that the grain size distribution, in which the average grain size gradually increases from the side of the interface between the hard coating layer and the body to the outer surface side of the hard coating layer, is formed in the cubic-crystal-structured (Ti, Al)(C, N) layer formed by vapor deposition by the chemical vapor deposition method. Because of this, the hard coating layer on the interface side with the body shows an excellent adhesion strength, and the hard coating layer exhibits an excellent wear resistance.

Further, the inventors of the present inventors found followings. When the cubic-crystal-structured (Ti, Al)(C, N) layer is formed by vapor deposition by the chemical vapor deposition method as explained above, a trace amount of chlorine is included in the layer. In the case where the average chlorine content is 1 atomic % or less, embrittlement of the hard coating layer does not occur without causing any negative effect. In the case where the hard coating layer has the compositional gradient structure in which the average chlorine content gradually reduces from the interface between the hard coating layer and the body to the outer surface side of the hard coating layer, not only lubricity but improved chipping resistance are obtained.

Because of the reasons described above, in the case where the coated tool with the above-described hard coating layer is used for high-speed intermittent cutting of alloy steel or the like, for example, occurrence of chipping, fracturing, peeling, or the like can be suppressed, and the hard coating layer exhibits an excellent wear resistance for a long-term use.

The present invention is made based on the findings described above, and has aspects shown below.

(1) A surface-coated cutting tool including: a cutting tool body made of any one of tungsten carbide-based cemented carbide, titanium carbonitride-based cermet, and cubic boron nitride nitride-based ultra-high pressure sintered material; and a hard coating layer coated on a surface of the cutting tool body, wherein (a) the hard coating layer includes at least a complex carbonitride layer of Ti and Al with a cubic crystal structure, the complex carbonitride layer being vapor-deposited by a chemical vapor deposition method and having an average thickness of 1-20 μm, (b) an Al content ratio X and a C content ratio Y satisfy $0.60 \le X \le 0.90$ and $0.0005 \le Y \le 0.005$, respectively, in the complex carbonitride layer: an average composition of the complex carbonitride layer being expressed by a composition formula, $(Ti_{1-X}Al_X)(C_YN_{1-Y})$; and X and Y being in atomic ratio, (c) an Al content ratio $X_L$ is $0.55 \le X_L \le 0.70$: a location L being a location 0.3 μm from an interface of the complex carbonitride layer on a side of the cutting tool body to an internal part of the complex carbonitride layer; compositional analysis being performed on a cross-section, which includes the location L and is perpendicular to the surface of the cutting tool body, centering around the location L to obtain an Al content ratio of the complex carbonitride layer of Ti and Al with a cubic crystal structure; and the Al content ratio $X_L$ being calculated as an average value of the obtained Al content ratio by the compositional analysis in atomic ratio;

an Al content ratio $X_H$ is $0.80 \le X_H \le 0.95$: a location H being a location 0.3 μm from an interface of the complex carbonitride layer on an outer surface side of the complex carbonitride layer to the internal part of the complex carbonitride layer; compositional analysis being performed on a cross-section, which includes the location H and is perpendicular to the surface of the cutting tool body, centering around the location H to obtain an Al content ratio of the complex carbonitride layer of Ti and Al with a cubic crystal structure; and the Al content ratio $X_H$ being calculated as an average value of the obtained Al content ratio by the compositional analysis in atomic ratio; and the complex carbonitride layer has a compositionally gradient structure in which the Al content ratio in the complex carbonitride layer gradually increases from the interface of the complex carbonitride layer on the side of the cutting tool body to the outer surface side of the complex carbonitride layer, and (d) an average grain size $D_L$, which is an average value of crystal grain width of the complex carbonitride in a cross-section including the location L and being parallel to the surface of the cutting tool body, is 0.1 μm or less;

an average grain size $D_H$, which is an average value of crystal grain width of the complex carbonitride in a cross-section including the location H and being parallel to the surface of the cutting tool body, is 0.5 μm to 2 μm; and an average grain size of the complex carbonitride layer of Ti and Al with the cubic crystal structure forms a grain size distribution gradually increasing from the interface of the complex carbonitride layer on the side of the cutting tool body to the outer surface side of the complex nitride layer.

(2) The surface-coated cutting tool according to the above-described (1), wherein the complex carbonitride layer includes chlorine in an average chlorine content of 0.001-1.0 atomic %.

(3) The surface-coated cutting tool according to the above-described (2), wherein an average chlorine content $C_L$ is 0.02-1.0 atomic %,
compositional analysis being performed on the cross-section, which includes the location L and is perpendicular to the surface of the cutting tool body, centering around the location L to obtain a chlorine content, and
the chlorine content $C_L$ being calculated as an average value of the obtained chlorine content by the compositional analysis,
an average chlorine content $C_H$ is 0.001-0.01 atomic %,
compositional analysis being performed on the cross-section, which includes the location H and is perpendicular to the surface of the cutting tool body, centering around the location H to obtain a chlorine content, and
the chlorine content $C_H$ being calculated as an average value of the obtained chlorine content by the compositional analysis, and
the complex carbonitride layer has a compositionally gradient structure in which an average chlorine content in the complex carbonitride layer gradually decreases from the interface of the complex carbonitride layer on the side of the cutting tool body to the outer surface side of the complex carbonitride layer.

(4) The surface-coated cutting tool according to any one of the above-described (1) to (3), wherein
the surface-coated cutting tool further includes a Ti compound layer between, the cutting tool body made of any one of tungsten carbide-based cemented carbide, titanium carbonitride-based cermet, and cubic boron nitride nitride-based ultra-high pressure sintered material; and the complex carbonitride layer of Ti and Al,
the Ti compound layer being made of at least one layer selected from the group consisting of a titanium carbide layer, a titanium nitride layer, a titanium carbonitride layer, a titanium carbonate layer and a titanium oxycarbonitride layer; and an average total thickness of the Ti compound layer being 0.1-20 μm.

(5) The surface-coated cutting tool according to any one of the above-described (1) to (4), wherein the hard coating layer further includes an aluminum oxide layer with an average layer thickness of 1-25 μm.

(6) The surface-coated cutting tool according to any one of above-described (1) to (5), wherein the aluminum oxide layer is formed on the complex carbonitride layer.

(7) The surface-coated cutting tool according to the above-described (5), wherein the Ti compound layer is formed on the cutting tool body, the complex carbonitride layer is formed on the Ti compound layer, the aluminum oxide layer is formed on the complex carbonitride layer, and the aluminum oxide layer is an outermost layer of the surface-coated cutting tool.

(8) The surface-coated cutting tool according to any one of the above-described (1) to (7), wherein the complex carbonitride layer is vapor-deposited by a chemical vapor deposition method in which at least trimethylaluminum is used as a reaction gas component.

As described above, the hard coating layer included in the coated tool of the present invention has the complex carbonitride layer as a basic makeup. However, the hart coating layer can exhibit even more excellent properties by being combined with conventional lower layers, upper layers, or the like.

Effects of the Invention

In the coated tool of the present invention: the cubic-crystal-structured $(Ti_{1-X}Al_X)(C_YN_{1-Y})$ layer is formed by vapor deposition by a chemical vapor deposition method as the complex carbonitride layer; the complex carbonitride layer has a compositionally gradient structure in which the Al content ratio gradually increases from the interface between the complex carbonitride layer and the body to the outer surface side of the complex carbonitride layer; the grain distribution in which the average grain size gradually increases is formed from the interface between the complex carbonitride layer and the body to the outer surface side of the complex carbonitride layer; and the complex nitride layer has a compositionally gradient structure in which the average chlorine content gradually decreases from the interface between the complex carbonitride layer and the body to the outer surface side of the complex carbonitride layer. Because of the configurations, the coated tool of the present invention has excellent adhesion strength, lubricity, chipping resistance, and wear resistance. Thus, the coated tool of the present invention can exhibit an excellent cutting performance for a long-term usage, even if it is used for high-speed milling cutting.

BRIEF DESCRIPTION OF THE DRAWINGS

FIG. 1 is a schematic illustration of the cross-section of the hard coating layer of the coated tool of the present invention.

DETAILED DESCRIPTION OF THE INVENTION

The coated tool with the hard coating layer, which is an embodiment of the present invention, is specifically explained below.

Average Composition of the Complex Carbonitride Layer of Ti and Al $((Ti_{1-X}Al_X)(C_YN_{1-Y}))$ Layer with a Cubic Crystal Structure:

In the $(Ti_{1-X}Al_X)(C_YN_{1-Y})$ layer, when the Al content ratio X (atomic ratio) is less than 0.06, high-temperature hardness becomes insufficient and the wear resistance is reduced. On the other hand, when the value X (atomic ratio) exceeds 0.90, the cubic crystal structure cannot be retained due to relative reduction of the Ti content ratio to cause reduction of high-temperature strength. Thus, chipping and fracturing tend to occur. Because of the reasons described above, it is necessary that the X value (atomic ratio) is set to 0.60 or higher and 0.90 or lower. More preferable range of the X value is 0.70 or higher and 0.88 or lower. Even more preferably, the value X is set to 0.78 or higher and 0.83 or lower.

In the case where the $(Ti_{1-X}Al_X)(C_YN_{1-Y})$ layer with above-described composition is formed by deposition by PVD method, the formed crystal structure is made of hexagonal crystals. In the present invention, the $(Ti_{1-X}Al_X)(C_YN_{1-Y})$ layer with the above-described composition can be obtained retaining the cubic crystal structure, since the layer is formed by vapor deposition by a chemical vapor deposition method. Thus, there is no reduction of hardness of the coating film.

Also, in the $(Ti_{1-X}Al_X)(C_YN_{1-Y})$ layer, C component has a function improving hardness of the layer, and N components has a function improving high-temperature strength of the layer. When the C-component content ratio Y (atomic ratio) is less than 0.0005, high hardness cannot be obtained. When the Y value (atomic ratio) exceeds 0.005, high-temperature strength starts declining. Therefore, the Y value (atomic ratio) is set to the range of 0.0005 or higher and 0.005 or lower. More preferable range of the Y value is 0.001 or higher and 0.003 or lower. Even more preferably, the value Y is set to 0.0015 or higher and 0.0025 or lower.

Also, when the average layer thickness of the $(Ti_{1-X}Al_X)(C_YN_{1-Y})$ layer is less than 1 μm, sufficient adhesion strength to the body cannot be obtained. On the other hand, then the average layer thickness exceeds 20 μm, thermoplastic deformation tends to occurs in high-speed milling cutting generating high heat, which causes uneven wear. Thus, the average total layer thickness of the $(Ti_{1-X}Al_X)(C_YN_{1-Y})$ layer is set to 1-20 μm.

In the hard coating layer of the coated tool of the present invention, the $(Ti_{1-X}Al_X)(C_YN_{1-Y})$ layer with the above-described average composition is not formed with a uniform composition over the entire layer. Instead, it forms the compositionally gradient structure in which the Al content ratio in the complex carbonitride layer increases continuously from the side of the interface of the complex carbonitride layer with the body to the outer surface side of the complex carbonitride layer.

In other words: the location L is defined as the location on the side of the interface with the body 0.3 μm from the interface between the surface of the body and the complex carbonitride layer to the internal part of the complex carbonitride layer; compositional analysis is performed on the cross-section, which includes the location L and is perpendicular to the surface of the body, centering around the location L; and the Al content ratio $X_L$ (atomic ratio) of the complex carbonitride layer of Ti and Al with a cubic crystal structure is set to 0.55 or higher and 0.70 or lower. In addition, the location H is defined as the location on the surface part 0.3 μm from the outer surface of the complex carbonitride layer to the internal part of the complex carbonitride layer; compositional analysis is performed on the cross-section, which includes the location H and is perpendicular to the surface of the body, centering around the location H; and the Al content ratio $X_H$ (atomic ratio) of the complex carbonitride layer of Ti and Al with a cubic crystal structure is set to 0.80 or higher and 0.95 or lower. In addition, the complex carbonitride layer has the compositionally gradient structure of Al in which the Al content ratio gradually increases from the interface side with the body of the complex carbonitride to the outer surface side of the complex carbonitride layer. In this compositionally gradient structure of Al, the Al content ratio does not decrease from the interface side with the body of the complex carbonitride to the outer surface side of the complex carbonitride layer.

By having the compositionally gradient structure, lattice strain due to the difference of the lattice constants according to their compositions is introduced in the complex carbonitride layer toward the outer surface side of the complex carbonitride layer. As a result, chipping resistance of the complex carbonitride layer improves.

In addition, in the hard coating layer of the coated tool of the present invention, in regard to the average grain size of the $(Ti_{1-X}Al_X)(C_YN_{1-Y})$ crystal grains constituting the complex carbonitride layer, the average grain size $D_L$ is set to a relatively low value ($D_L \leq 0.1$ μm) in the complex carbonitride layer on the side of the interface with the body. On the other hand, the average grain size $D_H$ is set to a relatively high value (0.5 μm $\leq D_H \leq 2$ μm) in the outer surface side of the complex carbonitride layer.

In other words: the average grain size $D_L$ is defined as the average value of grain width of the complex carbonitride crystal grains of Ti and Al with a cubic crystal structure on the surface parallel to the surface of the body at the location L on the side of the interface with the body 0.3 μm from the interface between the surface of the body and the complex carbonitride layer to the internal part of the complex carbonitride layer; and the average grain size $D_L$ is 0.1 μm or less. In addition: the average grain size $D_H$ is defined as the average value of grain width of the complex carbonitride crystal grains of Ti and Al with a cubic crystal structure on the surface parallel to the surface of the body at the location H on the surface part 0.3 μm from the outer surface of the complex carbonitride layer to the internal part of the complex carbonitride layer; and the average grain size DH is 0.5 μm $\leq D_H \leq 2$ μm. In addition, the grain size distribution, in which the average grain size gradually increases in the thickness direction from the side of the interface between the complex carbonitride layer and the body to the outer surface side of the complex carbonitride layer, is formed.

In the coated tool of the present invention, by forming the above-described grain size distribution in the thickness direction, adhesion strength of the complex carbonitride layer can be improved on the side of the interface with the body, and excellent wear resistance of the complex carbonitride layer can be obtained on the outer surface side of the complex carbonitride layer.

In the coated tool of the present invention, the $(Ti_{1-X}Al_X)(C_YN_{1-Y})$ layer is formed by vapor deposition by a chemical vapor deposition method as explained later. In this process, chlorine included in the reaction gas is incorporated into the layer.

When an excess amount of chlorine (more than 1 atomic %) is incorporated in the layer, it causes embrittlement of the layer itself. As long as the amount of chlorine is kept in a trace amount in the range of 0.001 atomic %-1 atomic %, lubricity can be improved without deteriorating the toughness of the layer. Therefore, it is preferable that the average chlorine content of 0.001 atomic %-1 atomic % is included in the layer.

In addition, in the case where the compositional gradient structure, in which the average chlorine content gradually reduces from the side of the interface between the complex carbonitride layer and the body to the outer surface side of the complex carbonitride layer, is formed during incorporation of chlorine in the layer, lubricity can be improved without deteriorating chipping resistance of the complex carbonitride layer.

Specifically: the location L is defined as the location 0.3 μm from the interface between the surface of the body and the complex carbonitride layer to the internal part of the complex carbonitride layer; compositional analysis is performed on the cross-section, which includes the location L and is perpendicular to the surface of the cutting tool body, centering around the location L to obtain a chlorine content to obtain chlorine content ratio; the average value of the obtained chlorine content ratio is calculated as the average chlorine content $C_L$; and the average chlorine content $C_L$ is set in the range of 0.02-1.0 atomic %. In addition: the location H is defined as the location 0.3 μm from the outer surface of the complex carbonitride layer to the internal part of the complex carbonitride layer; compositional analysis is performed on the cross-section, which includes the location H and is perpendicular to the surface of the cutting tool body, centering around the location H to obtain a chlorine content to obtain chlorine content ratio; the average value of the obtained chlorine content ratio is calculated as the average chlorine content $C_H$; and the average chlorine content $C_H$ is set in the range of 0.001-0.01 atomic %. Furthermore, the compositionally gradient structure, in which the average chlorine content gradually reduces toward the outer surface side of the complex carbonitride layer, is formed. Because of these, lubricity and chipping resistance of the complex carbonitride layer can be improved.

The $(Ti_{1-X}Al_X)(C_YN_{1-Y})$ layer of the coated tool of the present invention can be formed by vapor deposition by a chemical vapor deposition method (thermal chemical vapor deposition method) in the condition explained below, for example.

Composition of reaction gas (volume %):
$TiCl_4$ 0.5-2.5%; $Al(CH_3)_3$ 0-5.0%, $AlCl_3$ 0-10.0%, $NH_3$ 11.0-15.0%, $N_2$ 0-5.0%, $C_2H_4$ 0-1.0%, Ar 0-5.0%, and balance $H_2$ Temperature of the reaction atmosphere: 700-900° C.
Pressure of the reaction atmosphere: 2-10 kPa By the thermal CVD method performed in the above-described condition, the complex carbonitride layer of Ti and Al with a cubic crystal structure is formed by vapor deposition. The complex carbonitride layer is expressed by the composition formula, $(Ti_{1-X}Al_X)(C_YN_{1-Y})$. The average composition of the complex carbonitride layer satisfies $0.6 \leq X \leq 0.90$ and $0.0005 \leq Y \leq 0.005$ (X and Y are atomic ratios).

In regard to the $(Ti_{1-X}Al_X)(C_YN_{1-Y})$ layer formed by vapor deposition by the chemical vapor deposition method (thermal chemical vapor deposition), the compositionally gradient structure, in which the Al content ratio gradually increases toward the outer surface side of the complex carbonitride layer, satisfying $0.55 \leq X_L \leq 0.70$ and $0.80 \leq X_H \leq 0.95$ can be formed by vapor deposition by adjusting the additive amount of trimethylaluminum $(Al(CH_3)_3)$, which is one of the reaction gas components explained above, with the progression of deposition for example, the Al content ratio $X_L$ (atomic ratio) and $X_H$ (atomic ratio) being the Al content ratios at the locations L and H in the complex carbonitride layer, respectively.

In the same manner as in the case of the compositionally gradient structure of Al, in regard to the grain size distribution in the thickness direction, by increasing the additive amount of trimethylaluminum $(Al(CH_3)_3)$, which is one of the reaction gas components explained above, with the progression of deposition for example, the grain size distribution in the thickness direction, in which the average grain size gradually increases from the side of the interface between the complex carbonitride layer and the body to the outer surface side of the complex carbonitride layer, can be formed.

Furthermore, in the above-described chemical vapor deposition method (thermal CVD method), the additive amount of the reaction gas component $AlCl_3$ is relatively reduced since the additive amount of the reaction gas component trimethylaluminum $(Al(CH_3)_3)$ is increased with the progression of deposition. Thus, the compositionally gradient structure, in which the average chlorine content in the $(Ti_{1-X}Al_X)(C_YN_{1-Y})$ layer formed by vapor deposition gradually reduces toward the outer surface side of the complex carbonitride layer, is formed.

Therefore, it is possible to obtain the intended complex carbonitride layer by adjusting the additive amount of the reaction gas component trimethylaluminum $(Al(CH_3)_3)$ depending on: the intended compositional gradients (Al, chlorine); the intended X value; the average grain size; the grain size distribution; average chlorine content; and the like, for example.

Also, when the complex carbonitride layer includes the Ti compound layer as the hard coating layer; the Ti compound layer is made of one layer or more than two layers selected from the group consisting of Ti carbide layer, Ti nitride layer, Ti carbonitride layer, Ti carbonate layer, and Ti oxycarbonitride layer; and the average total thickness of the Ti compound layer is 0.1 to 20 µm, and/or when the complex carbonitride layer includes aluminum oxide layer with the average thickness of 1-25 µm, the above-mentioned properties are not deteriorated. Thus, by combining the complex carbonitride layer with these conventionally known lower layer and upper layer, even more superior property can be created.

Next, the coated tool of the present invention is specifically explained by Examples.

Example 1

As raw material powders, the WC powder, the TiC powder, the ZrC powder, the TaC powder, the NbC powder, the $Cr_3C_2$ powder, and the Co powder, all of which had the average grain sizes of 1-3 µm, were prepared. These raw material powders were blended in the blending composition shown in Table 1. Then, wax was added to the blended mixture, and further mixed in acetone for 24 hours with a ball mill. After drying under reduced pressure, the mixtures were press-molded into green compacts with a predetermined shape under pressure of 98 MPa. Then, the obtained green compacts were sintered in vacuum in the condition of 5 Pa vacuum at the predetermined temperature in the range of 1370-1470° C. for 1 hour retention. After sintering, the cutting tool bodies A-D, which had the insert-shape defined by ISO-SEEN1203AFSN and made of WC-based cemented carbide, were produced.

Also, as raw material powders, the TiCN powder (TiC/TiN=50/50 in mass ratio), the $Mo_2C$ powder, the ZrC powder, the NbC powder, the TaC powder, the WC powder, the Co powder, and the Ni powders, all of which had the average grain sizes of 0.2-2 µm, were prepared. These raw material powders were blended in the blending composition shown in Table 2. Then, with a ball mill, the obtained mixtures were subjected to wet-mixing for 24 hours. After drying, the mixtures were press-molded into green compacts under pressure of 98 MPa. The obtained green compacts were sintered in the condition of: in nitrogen atmosphere of 1.3 kPa; at a temperature of 1540° C.; and for 1 hour of the retention time. After sintering, the cutting tool bodies a-d, which had the insert-shape defined by ISO-SEEN1203AFSN and made of TiCN-based cermet, were produced.

TABLE 1

| Type | | Blending composition (mass %) | | | | | | |
|------|---|----|-----|-----|-----|-----|---------|---------|
|      |   | Co | TiC | ZrC | TaC | NbC | $Cr_3C_2$ | WC      |
| Cutting tool body | A | 8.0 | 1.5 | — | — | 3.0 | 0.4 | Balance |
|  | B | 8.0 | — | — | 1.8 | 0.2 | — | Balance |
|  | C | 9.0 | — | 0.5 | 0.9 | 0.1 | 0.5 | Balance |
|  | D | 10.0 | — | — | 1.8 | 0.2 | 0.6 | Balance |

TABLE 2

| Type | | Blending composition (mass %) | | | | | | | |
|---|---|---|---|---|---|---|---|---|---|
| | | Co | Ni | ZrC | TaC | NbC | $Mo_2C$ | WC | TiCN |
| Cutting tool body | a | 12 | 6 | — | 10 | — | 10 | 16 | Balance |
| | b | 7 | 7 | — | 5 | — | 7.5 | — | Balance |
| | c | 9 | 6 | — | 11 | 2 | — | — | Balance |
| | d | 8 | 5 | 1 | 8 | — | 10 | 10 | Balance |

Next, the coated-cutting tools of the present invention 1-15 indicated in Tables 6 and 7 were produced by vapor depositing the $(Ti_{1-X}Al_X)(C_YN_{1-Y})$ layer of the cutting tool related to the present invention on the surfaces of the cutting tool bodies A-D and the cutting tool bodies a-d in intended thicknesses using a standard chemical vapor deposition apparatus in the conditions indicated in Tables 3 and 4.

For the coated-cutting tools of the present invention 6-13, the lower layer and/or the upper layer were formed in the coating conditions indicted in Table 3.

For comparison purposes, the coated-cutting tools of Comparative Examples 1-8 indicated in Tables 6 and 8 were produced by vapor depositing $(Ti_{1-X}Al_X)(C_YN_{1-Y})$ of Comparative Example on the surface of the cutting tool bodies A-D and the cutting tool bodies a-d in intended thicknesses using a standard chemical vapor deposition apparatus in the conditions indicated in Tables 3 and 5 in the same manner.

Similarly to the coated-cutting tools of the present invention 6-13, for the coated-cutting tools of Comparative Examples 6-13, the lower layer and/or the upper layer were formed in the coating conditions indicted in Table 3.

For reference, the coated-cutting tools of Reference Example 14 and 15 indicated in Tables 6 and 8 were produced by vapor depositing $(Ti_{1-X}Al_X)(C_YN_{1-Y})$ of Reference Example on the surface of the cutting tool bodies D and c in intended thicknesses using a conventional physical vapor deposition apparatus by arc-ion plating.

The condition for the arc-ion plating is as described below.

(a) The tool bodies A and a were subjected to ultrasonic cleaning in acetone. Then, the cleaned tool bodies A and a in a dried state were set along the outer peripheral part in positions spaced away from the central axis in a predetermined distance in the radius direction on the rotating table in the arc-ion plating apparatus. As the cathode electrode (vaporization source), an Al—Ti alloy with a predetermined composition was placed.

(b) Inside of the apparatus was heated to 500° C. by a heater while retaining vacuum less than $10^{-2}$ Pa by exhausting atmosphere in the apparatus. Then, direct current bias voltage of −1000V was applied to the tool bodies rotating and orbiting on the rotation table. At the same time, arc discharge was generated by flowing current of 200 A between the cathode electrode made of the Al—Ti alloy and the anode electrode. By following the procedure described above, Al and Ti ions were formed in the apparatus to perform bombard cleaning on the surfaces of the tool bodies.

(c) Next, direct current bias voltage of −50V was applied to the tool bodies rotating and orbiting on the rotating table while turning the atmosphere in the apparatus to the reaction atmosphere of 4 Pa by introducing nitrogen gas as a reaction gas in the apparatus. At the same time, arc discharge was generated by flowing current of 120 A between the cathode electrode (vaporization source) made of the Al—Ti alloy and the anode electrode. By following above-described procedure, the coating layers made of (Al, Ti)N layer with the intended average compositions and the intended average layer thicknesses were vapor-deposited on the surfaces of the tool bodies and the coated-cutting tools of Reference Example 14 and 15 were produced.

Next, in regard to the hard coating layers of the above-described coated tools of the present invention 1-15, the average layer thickness of each layer of the hard coating layer; the average Al content ratio X of the complex carbonitride layer; the average C content ratio Y; the Al content ratios $X_L$ and $X_H$; the average grain sizes $D_L$ and $D_H$; the average chlorine content; the average chlorine content $C_L$; and the average chlorine content $C_H$ were measured.

Specific measurements were performed as described below.

First, the surface of the complex carbonitride layer was obtained by polishing or the like if necessary. In the case where the complex carbonitride layer was the outermost layer of the coated tool, the surface of the complex carbonitride layer was analyzed directly without the above-mentioned treatment such as polishing or the like.

Then, X-ray with the spot diameter of 100 μm was irradiated on the surface of the complex carbonitride layer by using an X-ray fluorescence spectrometer, and the average Al content ratio X; the average C content ratio Y; and the average chlorine content, were obtained based on the acquired analysis results of the characteristic X-ray.

Next, the cross-section perpendicular to the surface of the body was prepared by using a diamond grinder. Then, an electron beam with the spot diameter of 0.2 μm was irradiated on the cross-section putting the location L in the center of the spot of the beam by using an electron probe microanalyzer apparatus, the location L being the location 0.3 μm from the interface between the complex carbonitride layer and the body to the internal part of the complex carbonitride layer. That is, the electron beam was irradiated from the location, which was 0.2 μm from the interface between the complex carbonitride layer and the body to the internal part of the complex carbonitride layer, to the other location, which was 0.4 μm from the interface to the internal part of the complex carbonitride layer, putting the location L in the middle of the measurement. Then, the average Al content ratio $X_L$ and the average chlorine content $C_L$ were obtained as the average values of 10 different points of the acquired analysis results of the characteristic X-ray in the above-described measurement. "Performing composition analysis centering on the location" means: irradiating the electron beam with the spot diameter of 0.2 μm around the central location; and obtaining a 10-points average of the acquired analysis results of the characteristic X-ray. The average grain size $D_L$ was obtained by: drawing the line $L_L$ of 50 μm of length parallel to the surface of the body on the location L; and dividing the length of the line $L_L$ with the number of crystal grains intersected by the line $L_L$. In addition, an electron beam with the spot diameter of 0.2 μm was irradiated on the cross-section putting the location H in the center of the spot of the beam, the location H being the location 0.3 μm from the outer surface of the complex carbonitride layer to the internal part of the complex carbonitride layer. That is, the electron beam was irradiated from the location, which was 0.2 μm from the outer surface of the complex carbonitride layer to the internal part of the complex carbonitride layer, to the other location, which was 0.4 μm from the outer surface of the complex carbonitride layer to the internal part of the complex carbonitride layer, putting the location H in the middle of the measurement. Then, the average Al content ratio $X_H$ and the average chlorine content $C_H$ were obtained as the average values of 10 different points of the acquired analysis results of the characteristic X-ray in the above-described measurement. The average grain size $D_H$ was obtained by: drawing the line $L_H$ of 50 μm of length parallel to the surface of the body on the location H; and dividing the length of the line $L_H$ with the number of crystal grains intersected by the line $L_H$. In addition, the existence of the gradient structure in terms of the Al content ratio and the average chlorine content in the complex carbonitride layer from the interface of the complex carbonitride layer on the side of the body toward the outer surface side of the complex carbonitride layer was confirmed by: segmenting equally the space between the location L and the location H in an interspace of 0.2 μm or more and 1.0 μm or less; irradiating the electron beam putting each of the segmenting points in the center of the spot; and obtaining the Al content ratios and the average chlorine contents based on the 10-points average of the acquired analysis results of the characteristic X-ray. In addition, formation of the grain size distribution gradually increasing from the interface of the complex carbonitride layer on the side of the body toward the outer surface side of the complex nitride layer was confirmed by obtaining the average grain sizes by: segmenting equally the space between the location L and the location H in an interspace of 0.2 μm or more and 1.0 μm or less; drawing the line of 50 μm of length in the horizontal direction to the surface of the body on each of the segmenting points; and dividing the length of the line with the number of crystal grains intersected by the line.

In addition, in regard to the average layer thickness of each of the hard coating layer, cross-section measurement was performed by using a scanning electron microscope, and layer thicknesses at 5 locations were measured for each layer constituting the hard coating layer to obtain average values. The average layer thickness of the hard coating layer was obtained as the total value of the average layer thicknesses of the above-described each layer.

In regard to the crystal structure of the complex carbonitride layer, it was investigated by confirming appearance of the diffraction peak between the diffraction angles of the equivalent crystal surfaces represented by JCPDS00-038-1420 for cubic crystal TiN and JCPDS00-046-120 for cubic crystal AlN (for examples, 36.66-38.53°, 43.59-44.77°, 61.81-65.18°, in the case where X-ray diffraction was performed by using Cu-Kα ray as the radiation source by using an X-ray diffractometer.

Next, in regard to each of the coated tools of Comparative Examples 1-13 and the coated tools of Reference Examples 14-15, the average layer thickness of each layer of the hard coating layer; the average Al content ratio x of the complex carbonitride layer; the average C content ratio y; the Al content ratios $x_L$ and $x_H$; the average grain sizes $d_L$ and $d_H$; the average chlorine content; the average chlorine content $c_L$; and the average chlorine content $c_H$ were measured, in the same manner as the coated tools of the present invention 1-15.

Similarly, the crystal structure of the complex carbonitride layer of each of the coated tools of Comparative Examples 1-13 and the coated tools of Reference Examples 14-15 was investigated in the same manner as the coated tools of the present invention 1-15.

The results were shown in Table 8.

TABLE 3

| Layers constituting the hard coating layer | | | Coating condition (atmosphere pressure is indicated in kPa, and atmosphere temperature is indicated in ° C.) | | |
|---|---|---|---|---|---|
| | | Formation | | Reaction atmosphere | |
| Type | | symbol | Reaction gas composition (volume %) | Pressure | Temperature |
| $(Ti_{1-X}Al_X)(C_YN_{1-Y})$ layer | TiAlCN | TiAlCN | Refer Tables 4 and 5 | 7 | 1000 |
| Ti compound layer | TiC | TiC | $TiCl_4$: 4.2%, $CH_4$: 8.5%, $H_2$: balance | 7 | 1020 |
| | TiN | TiN-1 | $TiCl_4$: 4.2%, $N_2$: 30%, $H_2$: balance | 30 | 900 |
| | | TiN-2 | $TiCl_4$: 4.2%, $N_2$: 35%, $H_2$: balance | 50 | 1040 |
| | | TiN-3 | $TiCl_4$: 4.2%, $N_2$: 30%, $H_2$: balance | 30 | 780 |
| | l-TiCN | l-TiCN-1 | $TiCl_4$: 2%, $CH_3CN$: 0.7%, $N_2$: 10%, $H_2$: balance | 7 | 900 |
| | | l-TiCN-2 | $TiCl_4$: 2%, $CH_3CN$: 0.7%, $N_2$: 10%, $H_2$: balance | 7 | 780 |
| | TiCN | TiCN | $TiCl_4$: 2%, $CH_4$: 1%, $N_2$: 15%, $H_2$: balance | 13 | 1000 |
| | TiCO | TiCO | $TiCl_4$: 4.2%, CO: 4%, $H_2$: balance | 7 | 1020 |
| | TiCNO | TiCNO | $TiCl_4$: 2%, CO: 1%, $CH_4$: 1%, $N_2$: 5%, $H_2$: balance | 13 | 1000 |
| $Al_2O_3$ layer | $Al_2O_3$ | $Al_2O_3$ | $AlCl_3$: 2.2%, $CO_2$: 5.5%, HCl: 2.2%, $H_2S$: 0.2%, $H_2$: balance | 7 | 1000 |

TABLE 4

| $(Ti_{1-X}Al_X)(C_YN_{1-Y})$ layer coating condition (atmosphere pressure is indicated in kPa, and atmosphere temperature is indicated in ° C.) | | | |
|---|---|---|---|
| Film deposition type | Reaction gas composition (volume %) | Reaction atmosphere | |
| | | Pressure | Temperature |
| A | (Immediately after beginning of coating) $TiCl_4$: 2%, $Al(CH_3)_3$: 0%, $AlCl_3$: 3%, $NH_3$: # %, $N_2$: 2%, $C_2H_4$: 0%, Ar: 3%, balance $H_2$ (Immediately before end of coating) $TiCl_4$: 2%, $Al(CH_3)_3$: 3%, $AlCl_3$: 0%, $NH_3$: # %, $N_2$: 2%, $C_2H_4$: 0%, Ar: 3%, balance $H_2$ | 5 | 800 |
| B | (Immediately after beginning of coating) $TiCl_4$: 3%, $Al(CH_3)_3$: 0%, $AlCl_3$: 5%, $NH_3$: # %, $N_2$: 0%, $C_2H_4$: 0%, Ar: 0%, balance $H_2$ (Immediately before end of coating) $TiCl_4$: 3%, $Al(CH_3)_3$: 5%, $AlCl_3$: 0%, $NH_3$: # %, $N_2$: 0%, $C_2H_4$: 0%, Ar: 0%, balance $H_2$ | 10 | 900 |

TABLE 4-continued ($Ti_{1-X}Al_X$)($C_YN_{1-Y}$) layer coating condition (atmosphere pressure is indicated in kPa, and atmosphere temperature is indicated in ° C.)

| Film deposition type | Reaction gas composition (volume %) | Reaction atmosphere Pressure | Temperature |
|---|---|---|---|
| C | (Immediately after beginning of coating) $TiCl_4$: 1%, $Al(CH_3)_3$: 0%, $AlCl_3$: 1%, $NH_3$: # %, $N_2$: 5%, $C_2H_4$: 0%, Ar: 5%, balance $H_2$ (Immediately before end of coating) $TiCl_4$: 1%, $Al(CH_3)_3$: 1%, $AlCl_3$: 0%, $NH_3$: # %, $N_2$: 5%, $C_2H_4$: 0%, Ar: 5%, balance $H_2$ | 2 | 700 |
| D | (Immediately after beginning of coating) $TiCl_4$: 2%, $Al(CH_3)_3$: 0%, $AlCl_3$: 10%, $NH_3$: # %, $N_2$: 1%, $C_2H_4$: 0%, Ar: 4%, balance $H_2$ (Immediately before end of coating) $TiCl_4$: 2%, $Al(CH_3)_3$: 5%, $AlCl_3$: 0%, $NH_3$: # %, $N_2$: 1%, $C_2H_4$: 0%, Ar: 4%, balance $H_2$ | 5 | 700 |
| E | (Immediately after beginning of coating) $TiCl_4$: 1%, $Al(CH_3)_3$: 0%, $AlCl_3$: 5%, $NH_3$: # %, $N_2$: 3%, $C_2H_4$: 0%, Ar: 2%, balance $H_2$ (Immediately before end of coating) $TiCl_4$: 1%, $Al(CH_3)_3$: 3%, $AlCl_3$: 0%, $NH_3$: # %, $N_2$: 3%, $C_2H_4$: 0%, Ar: 2%, balance $H_2$ | 2 | 900 |
| F | (Immediately after beginning of coating) $TiCl_4$: 2%, $Al(CH_3)_3$: 0%, $AlCl_3$: 5%, $NH_3$: # %, $N_2$: 0%, $C_2H_4$: 0%, Ar: 0%, balance $H_2$ (Immediately before end of coating) $TiCl_4$: 2%, $Al(CH_3)_3$: 3%, $AlCl_3$: 0%, $NH_3$: # %, $N_2$: 0%, $C_2H_4$: 0%, Ar: 0%, balance $H_2$ | 5 | 800 |
| G | (Immediately after beginning of coating) $TiCl_4$: 3%, $Al(CH_3)_3$: 0%, $AlCl_3$: 7.5%, $NH_3$: # %, $N_2$: 4%, $C_2H_4$: 0%, Ar: 1%, balance $H_2$ (Immediately before end of coating) $TiCl_4$: 3%, $Al(CH_3)_3$: ## %, $AlCl_3$: 0%, $NH_3$: # %, $N_2$: 4%, $C_2H_4$: 0%, Ar: 1%, balance $H_2$ | 2 | 700 |
| H | (Immediately after beginning of coating) $TiCl_4$: 2%, $Al(CH_3)_3$: 0%, $AlCl_3$: 6%, $NH_3$: # %, $N_2$: 3%, $C_2H_4$: 0%, Ar: 3%, balance $H_2$ (Immediately before end of coating) $TiCl_4$: 2%, $Al(CH_3)_3$: ## %, $AlCl_3$: 0%, $NH_3$: # %, $N_2$: 3%, $C_2H_4$: 0%, Ar: 3%, balance $H_2$ | 10 | 700 |
| I | (Immediately after beginning of coating) $TiCl_4$: 2%, $Al(CH_3)_3$: 0%, $AlCl_3$: 3%, $NH_3$: # %, $N_2$: 0%, $C_2H_4$: 0%, Ar: 5%, balance $H_2$ (Immediately before end of coating) $TiCl_4$: 2%, $Al(CH_3)_3$: 0%, $AlCl_3$: 3%, $NH_3$: # %, $N_2$: 5%, $C_2H_4$: 1%, Ar: 0%, balance $H_2$ | 10 | 800 |
| J | (Immediately after beginning of coating) $TiCl_4$: 1%, $Al(CH_3)_3$: 0%, $AlCl_3$: 2%, $NH_3$: # %, $N_2$: 1%, $C_2H_4$: 0%, Ar: 1%, balance $H_2$ (Immediately before end of coating) $TiCl_4$: 1%, $Al(CH_3)_3$: 2%, $AlCl_3$: 0%, $NH_3$: # %, $N_2$: 1%, $C_2H_4$: 0%, Ar: 1%, balance $H_2$ | 2 | 800 |

Note:
The reason for the difference of reaction gas compositions between "Immediately after beginning of coating" and "Immediately before end of coating" was due to increasing of the additive amount of $Al(CH_3)_3$ component with the progress of coating.

TABLE 5

($Ti_{1-X}Al_X$)($C_YN_{1-Y}$) layer coating condition (atmosphere pressure is indicated in kPa, and atmosphere temperature is indicated in ° C.)

| Film Deposition Type | Reaction gas composition (volume %) | Reaction atmosphere Pressure | Temperature |
|---|---|---|---|
| a | $TiCl_4$: 1.5%, $Al(CH_3)_3$: 0%, $AlCl_3$: 3%, $NH_3$: 15%, $N_2$: 3%, $C_2H_4$: 0%, Ar: 3%, balance $H_2$ | 5 | 800 |
| b | $TiCl_4$: 2.5%, $Al(CH_3)_3$: 0%, $AlCl_3$: 5%, $NH_3$: 11%, $N_2$: 0%, $C_2H_4$: 0%, Ar: 0%, balance $H_2$ | 5 | 800 |
| c | $TiCl_4$: 0.5%, $Al(CH_3)_3$: 0%, $AlCl_3$: 1%, $NH_3$: 15%, $N_2$: 5%, $C_2H_4$: 0%, Ar: 5%, balance $H_2$ | 5 | 700 |
| d | $TiCl_4$: 2.0%, $Al(CH_3)_3$: 0%, $AlCl_3$: 10%, $NH_3$: 11%, $N_2$: 0%, $C_2H_4$: 0%, Ar: 5%, balance $H_2$ | 5 | 800 |
| e | $TiCl_4$: 1.0%, $Al(CH_3)_3$: 0%, $AlCl_3$: 5%, $NH_3$: 15%, $N_2$: 3%, $C_2H_4$: 0%, Ar: 3%, balance $H_2$ | 5 | 800 |
| f | $TiCl_4$: 1.5%, $Al(CH_3)_3$: 0%, $AlCl_3$: 5%, $NH_3$: 11%, $N_2$: 0%, $C_2H_4$: 0%, Ar: 0%, balance $H_2$ | 5 | 700 |
| g | $TiCl_4$: 2.5%, $Al(CH_3)_3$: 0%, $AlCl_3$: 7.5%, $NH_3$: 11%, $N_2$: 5%, $C_2H_4$: 0%, Ar: 0%, balance $H_2$ | 5 | 800 |
| h | $TiCl_4$: 1.5%, $Al(CH_3)_3$: 0%, $AlCl_3$: 6%, $NH_3$: 11%, $N_2$: 3%, $C_2H_4$: 0%, Ar: 3%, balance $H_2$ | 5 | 800 |

TABLE 6

| Type | Cutting tool body symbol | Hard coating layer (numbers in the bottom line indicate intended average layer thickness of the layer (μm)) Lower layer | | |
|---|---|---|---|---|
| | | 1st layer | 2nd layer | 3rd layer |
| Coated tools of present invention, coated tools of | 1 | a | — | — | — |
| | 2 | A | — | — | — |
| Comparative Example, and coated tools of Reference Example | 3 | b | — | — | — |
| | 4 | B | — | — | — |
| | 5 | c | — | — | — |

TABLE 6-continued

Hard coating layer (numbers in the bottom line indicate intended average layer thickness of the layer (μm)) Lower layer

| Type | Cutting tool body symbol | 1st layer | 2nd layer | 3rd layer |
|---|---|---|---|---|
| 6 | C | TiC (0.5) | — | — |
| 7 | d | TiN-1 (0.3) | — | — |
| 8 | D | TiN-1 (0.5) | 1-TiCN-1 (4) | — |
| 9 | A | TiN-1 (0.3) | 1-TiCN-1 (2) | TiCN (0.7) |
| 10 | a | — | — | — |
| 11 | B | TiN-1 (0.5) | — | — |
| 12 | b | TiC (1) | — | — |
| 13 | C | TiN-1 (0.1) | — | — |
| 14 | c | — | — | — |
| 15 | D | — | — | — |

TABLE 7

Hard coating layer Complex carbonitride layer [$(Ti_{1-X}Al_X)(C_YN_{1-Y})$ layer]

| Type | Cutting tool body symbol | TiAlCN coating process formation symbol (refer Table 4) | Average layer thickness (μm) | Average Al content ratio X | Al content ratio $X_L$ | Al content ratio $X_H$ | Average C content ratio Y | Average grain diameter $D_L$ (μm) | Average grain diameter $D_H$ (μm) |
|---|---|---|---|---|---|---|---|---|---|
| Coated tools of the present invention | 1 | A | A | 5 | 0.85 | 0.65 | 0.91 | 0.0021 | 0.05 | 1.2 |
| | 2 | a | B | 1 | 0.82 | 0.61 | 0.88 | 0.0005 | 0.06 | 1.8 |
| | 3 | B | C | 12 | 0.86 | 0.67 | 0.90 | 0.005 | 0.04 | 0.8 |
| | 4 | b | D | 5 | 0.81 | 0.70 | 0.95 | 0.0008 | 0.05 | 0.5 |
| | 5 | C | E | 4 | 0.89 | 0.68 | 0.92 | 0.0032 | 0.1 | 1.4 |
| | 6 | c | F | 7 | 0.88 | 0.63 | 0.92 | 0.0013 | 0.05 | 2 |
| | 7 | D | G | 4 | 0.79 | 0.58 | 0.84 | 0.0025 | 0.02 | 1.3 |
| | 8 | d | H | 8 | 0.82 | 0.64 | 0.91 | 0.0041 | 0.06 | 0.7 |
| | 9 | a | I | 7 | 0.60 | 0.55 | 0.80 | 0.0018 | 0.07 | 1.4 |
| | 10 | A | J | 8 | 0.86 | 0.69 | 0.89 | 0.0028 | 0.06 | 1.1 |
| | 11 | b | E | 7 | 0.90 | 0.68 | 0.92 | 0.0032 | 0.1 | 1.4 |
| | 12 | B | D | 3 | 0.76 | 0.70 | 0.95 | 0.0008 | 0.05 | 0.5 |
| | 13 | c | C | 9 | 0.86 | 0.67 | 0.90 | 0.005 | 0.04 | 0.8 |
| | 14 | C | B | 2 | 0.82 | 0.61 | 0.88 | 0.0005 | 0.06 | 1.8 |
| | 15 | d | A | 8 | 0.85 | 0.65 | 0.91 | 0.0021 | 0.05 | 1.2 |

Hard coating layer

| | | Complex carbonitride layer [$(Ti_{1-X}Al_X)(C_YN_{1-Y})$ layer] | | | | Upper layer (numbers in the bottom line indicate intended average layer thickness of the layer (μm)) | |
|---|---|---|---|---|---|---|---|
| Type | | Average chlorine content (atomic %) | Average chlorine content $C_L$ (atomic %) | Average chlorine content $C_H$ (atomic %) | Remarks | 1st layer | 2nd layer |
| Coated tools of the present invention | 1 | 0.02 | 0.06 | 0.008 | Cubic crystal | — | — |
| | 2 | 0.4 | 0.5 | 0.01 | Cubic crystal | — | — |
| | 3 | 0.009 | 0.02 | 0.005 | Cubic crystal | — | — |
| | 4 | 0.3 | 0.9 | 0.001 | Cubic crystal | — | — |
| | 5 | 0.1 | 0.2 | 0.005 | Cubic crystal | — | — |
| | 6 | 0.05 | 0.6 | 0.004 | Cubic crystal | — | — |
| | 7 | 0.9 | 1 | 0.01 | Cubic crystal | — | — |

TABLE 7-continued

| | | | | | | | |
|---|---|---|---|---|---|---|---|
| 8 | 0.004 | 0.6 | 0.001 | Cubic crystal | — | — |
| 9 | 1.1 | 1.2 | 0.02 | Cubic crystal | — | — |
| 10 | 0.005 | 0.05 | 0.007 | Cubic crystal | $Al_2O_3$ (5) | — |
| 11 | 0.1 | 0.2 | 0.005 | Cubic crystal | TiCN (0.5) | $Al_2O_3$ (3) |
| 12 | 0.3 | 0.9 | 0.001 | Cubic crystal | TiCO (1) | $Al_2O_3$ (2) |
| 13 | 0.009 | 0.02 | 0.005 | Cubic crystal | TiCNO (0.3) | $Al_2O_3$ (1) |
| 14 | 0.4 | 0.5 | 0.01 | Cubic crystal | — | — |
| 15 | 0.02 | 0.06 | 0.008 | Cubic cyrstal | — | — |

TABLE 8

| Type | | Cutting tool body symbol | TiAlCN coating process formation symbol (refer Table 4) | Hard coating layer | | | | | | | | | | Upper layer (numbers in the bottom line indicate intended average layer thickness of the layer (μm)) | |
|---|---|---|---|---|---|---|---|---|---|---|---|---|---|---|---|
| | | | | Complex carbonitride layer [(Ti$_{1-X}$Al$_X$)(C$_Y$N$_{1-Y}$) layer] | | | | | | | | | | 1st layer | 2nd layer |
| | | | | Average layer thickness (μm) | Average Al content ratio X | Al content ratio X$_L$ | Al content ratio X$_H$ | Average C content ratio Y | Average grain diameter D$_L$ (μm) | Average grain diameter D$_H$ (μm) | Average chlorine content (atomic %) | Average chlorine content C$_L$ (atomic %) | Average chlorine content C$_H$ (atomic %) | Remarks | | |
| Coated tools of Comparative Example | 1 | A | a | 5 | 0.60 | 0.55 | *0.56 | *0.0001 | 0.05 | *0.1 | 0.06 | 0.06 | 0.05 | Cubic crystal | — | — |
| | 2 | a | b | 1 | 0.61 | 0.61 | *0.60 | *0.0002 | 0.06 | *0.12 | 0.6 | 0.6 | 0.6 | Cubic crystal | — | — |
| | 3 | B | c | 12 | 0.6 | 0.58 | *0.6 | *0.0002 | 0.04 | *0.21 | 0.02 | 0.02 | 0.02 | Cubic crystal | — | — |
| | 4 | b | d | 5 | 0.66 | 0.65 | *0.67 | *0.0001 | 0.05 | *0.08 | 0.8 | 0.9 | 0.8 | Cubic crystal | — | — |
| | 5 | C | e | 4 | 0.66 | 0.64 | *0.66 | *0.0001 | 0.07 | *0.15 | 0.3 | 0.3 | 0.2 | Cubic crystal | — | — |
| | 6 | c | f | 7 | 0.6 | 0.59 | *0.62 | *0.0002 | 0.05 | *0.12 | 0.7 | 0.7 | 0.6 | Cubic crystal | — | — |
| | 7 | D | g | 4 | 0.62 | 0.56 | *0.58 | *0.0001 | 0.04 | *0.13 | 1 | 1 | 0.9 | Cubic crystal | — | — |
| | 8 | d | h | 8 | 0.63 | 0.62 | *0.64 | *0.0002 | 0.06 | *0.18 | 0.4 | 0.5 | 0.4 | Cubic crystal | — | — |
| | 9 | a | e | 7 | 0.66 | 0.64 | *0.66 | *0.0001 | 0.07 | *0.15 | 0.3 | 0.3 | 0.2 | Cubic crystal | — | — |
| | 10 | A | d | 8 | 0.66 | 0.65 | *0.67 | *0.0001 | 0.05 | *0.08 | 0.8 | 0.9 | 0.8 | Cubic crystal | Al$_2$O$_3$ (5) | — |
| | 11 | b | c | 7 | 0.60 | 0.58 | *0.6 | *0.0002 | 0.04 | *0.21 | 0.02 | 0.02 | 0.02 | Cubic crystal | TiCN (0.5) | Al$_2$O$_3$ (3) |
| | 12 | B | b | 3 | 0.61 | 0.61 | *0.60 | *0.0002 | 0.06 | *0.12 | 0.6 | 0.6 | 0.6 | Cubic crystal | TiCO (1) | Al$_2$O$_3$ (2) |
| | 13 | c | a | 9 | 0.66 | 0.55 | *0.56 | *0.0001 | 0.05 | *0.1 | 0.06 | 0.06 | 0.05 | Cubic crystal | TiCNO (0.3) | Al$_2$O$_3$ (1) |
| Coated tools of Reference Example | 14 | C | AIP | 2 | 0.8 | *0.8 | 0.81 | *0 | 0.05 | *0.22 | 0 | 0 | 0 | *Hexagonal crystal | — | — |
| | 15 | d | AIP | 8 | 0.85 | *0.85 | 0.84 | *0 | 0.06 | *0.24 | 0 | 0 | 0 | *Hexagonal crystal | — | — |

Note 1:
"AIP" means coating by arc ion plating.
Note 2:
*mark in the table indicates the parameter is out of the ranges in the scope of the present invention.

Next, each coated tool described above was clamped on the face milling cutter made of tool steel with the cutter diameter of 125 mm by a fixing jig. Then, the center cut cutting test of high speed dry face milling was performed on the coated tools of the present invention 1-15; the coated tools of Comparative Example 1-13; and the coated tools of Reference Example 14-15, in the clamped-state. The center cut cutting test of high speed dry face milling is a type of high speed intermittent cutting of alloy steel, and was performed under the condition shown below. After the test, width of flank wear of the cutting edge was measured.

Work: Block material of JIS-SCM440 standard having width of 97 mm and length of 400 mm
Rotation speed: 890 min$^{-1}$
Cutting speed: 350 m/min
Cutting depth: 1 mm
Feed rate per tooth: 0.1 mm/tooth
Cutting time: 10 minutes The results of the cutting test are shown in Table 9.

TABLE 9

| Type | | Width of flank wear (mm) | Type | | Cutting test result (min) |
|---|---|---|---|---|---|
| Coated tools of the present invention | 1 | 0.07 | Coated tools of Comparative Example | 1 | *5.3 |
| | 2 | 0.12 | | 2 | *4.2 |
| | 3 | 0.14 | | 3 | *3.9 |
| | 4 | 0.10 | | 4 | *5.6 |
| | 5 | 0.09 | | 5 | *4.7 |
| | 6 | 0.09 | | 6 | *3.5 |
| | 7 | 0.11 | | 7 | *5.4 |
| | 8 | 0.11 | | 8 | *3.4 |
| | 9 | 0.22 | | 9 | *3.5 |
| | 10 | 0.08 | | 10 | *4.2 |
| | 11 | 0.09 | | 11 | *3.4 |
| | 12 | 0.10 | | 12 | *3.9 |
| | 13 | 0.11 | | 13 | *3.1 |
| | 14 | 0.13 | Coated tools of Reference Example | 14 | *3.1 |
| | 15 | 0.07 | | 15 | *2.8 |

The * mark in the column of coated tools of Comparative Example and Reference Example indicates the cutting time (min) until reaching to its service life because of occurrence of chipping.

Example 2

As raw material powders, the WC powder, the TiC powder, the ZrC powder, the VC powder, the NbC powder, the $Cr_3C_2$ powder, and the TiN powder, all of which had the average grain sizes of 1-3 μm, were prepared. These raw material powders were blended in the blending composition shown in Table 10. Then, wax was added to the blended mixture, and further mixed in acetone for 24 hours with a ball mill. After drying under reduced pressure, the mixtures were press-molded into green compacts with a predetermined shape under pressure of 98 MPa. Then, the obtained green compacts were sintered in vacuum in the condition of 5 Pa vacuum at the predetermined temperature in the range of 1370-1470° C. for 1 hour retention. After sintering, the cutting tool bodies α-ε, which had the insert-shape defined by ISO standard CNMG120412 and made of WC-based cemented carbide, were produced by performing honing (R: 0.07 mm) on the cutting edge part.

Also, as raw material powders, the TiCN powder (TiC/TiN=50/50 in mass ratio), the $Mo_2C$ powder, the ZrC powder, the NbC powder, the TaC powder, the WC powder, the Co powder, and the Ni powder, all of which had the average grain sizes of 0.5-2 μm, were prepared. These raw material powders were blended in the blending composition shown in Table 11. Then, the mixtures were wet-mixed for 24 hours with a ball mill. After drying, the mixtures were press-molded into green compacts under pressure of 98 MPa. The, obtained green compacts were sintered in nitrogen atmosphere of 1.3 kPa at 1540° C. for 1 hour retention. After sintering, the cutting tool bodies ζ-κ, which had the insert-shape defined by ISO standard CNMG120412 and made of TiCN-based cermet, were produced by performing honing (R: 0.09 mm) on the cutting edge part.

Next, the coated-cutting tools of the present invention 16-30 indicated in Tables 12 and 13 were produced by vapor depositing the $(Ti_{1-X}Al_X)(C_YN_{1-Y})$ layer of the cutting tool related to the present invention on the surfaces of the cutting tool bodies α-ε and the cutting tool bodies ζ-κ in intended thicknesses using a standard chemical vapor deposition apparatus in the conditions indicated in Tables 3 and 4.

For the coated-cutting tools of the present invention 19-28, the lower layer and/or the upper layer were formed in the coating conditions indicted in Table 3.

For comparison purposes, the coated-cutting tools of Comparative Examples 16-28 indicated in Tables 12 and 14 were produced by vapor depositing $(Ti_{1-X}Al_X)(C_YN_{1-Y})$ of Comparative Example on the surface of the cutting tool bodies α-ε and the cutting tool bodies ζ-κ in intended thicknesses using a standard chemical vapor deposition apparatus in the conditions indicated in Tables 3 and 5 in the same manner.

Similarly to the coated-cutting tools of the present invention 19-28, for the coated-cutting tools of Comparative Examples 19-28, the lower layer and/or the upper layer were formed in the coating conditions indicted in Table 3.

For reference, the coated-cutting tools of Reference Example 29 and 30 indicated in Tables 12 and 14 were produced by vapor depositing $(Ti_{1-X}Al_X)(C_YN_{1-Y})$ layer of Reference Example on the surface of the cutting tool bodies β and θ in intended thicknesses using a conventional physical vapor deposition apparatus by arc-ion plating.

The condition for the arc-ion plating was the same as described in Example 1. By vapor depositing $(Ti_{1-X}Al_X)(C_YN_{1-Y})$ layer on the surfaces of the above-mentioned cutting tool bodies in the intended average compositions and layer thicknesses indicated in Table 14 in the arc-ion plating, the coated tools of Reference Example 29 and 30 were produced.

Next, in regard to the hard coating layers of the above-described coated tools of the present invention 16-30, the average layer thickness of each layer of the hard coating layer; the average Al content ratio X of the complex carbonitride layer; the average C content ratio Y; the Al content ratios $X_L$ and $X_H$; the average grain sizes $D_L$ and $D_H$; the average chlorine content; the average chlorine content $C_L$; and the average chlorine content $C_H$ were measured by using the same methods as the methods described in Example 1.

Results were indicated in Table 13.

Next, in regard to the coated tools of Comparative Examples 16-28 and the coated tools of Reference Examples 29-30, the average layer thickness of each layer of the hard coating layer; the average Al content ratio X of the complex carbonitride layer; the average C content ratio Y; the Al content ratios $X_L$ and $X_H$; the average grain sizes $D_L$ and $D_H$; the average chlorine content; the average chlorine content $C_L$; and the average chlorine content $C_H$ were measured, in the same manner as the coated tools of the present invention 16-30.

The results were shown in Table 14.

TABLE 10

| Type | | Blending composition (mass %) | | | | | | | |
|---|---|---|---|---|---|---|---|---|---|
| | | Co | TiC | ZrC | VC | TaC | NbC | $Cr_3C_2$ | TiN | WC |
| Cutting tool body | α | 6.5 | 1.5 | — | — | — | 2.9 | 0.1 | 1.5 | Balance |
| | β | 7.6 | 2.6 | — | — | 4.0 | 0.5 | — | 1.1 | Balance |
| | γ | 8.4 | — | 0.6 | — | 0.5 | 2.5 | 0.2 | 2 | Balance |
| | δ | 6.6 | — | — | — | 1.7 | 0.2 | — | — | Balance |
| | ε | 10 | — | — | 0.2 | — | — | 0.2 | — | Balance |

TABLE 11

| Type | | Blending composition (mass %) | | | | | | | |
|---|---|---|---|---|---|---|---|---|---|
| | | Co | Ni | ZrC | TaC | NbC | $Mo_2C$ | WC | TiCN |
| Cutting tool body | ζ | 18.5 | 8.5 | — | 10.5 | — | 10.5 | 16 | Balance |
| | η | 11 | — | — | — | 1 | 6 | 10 | Balance |
| | θ | 13 | 6.5 | — | 11 | 2 | — | — | Balance |
| | ι | 12 | 7.5 | 1 | 8 | — | 10 | 10.5 | Balance |
| | κ | 15 | 8.5 | — | 10 | — | 9.5 | 14.5 | Balance |

TABLE 12

| Type | Cutting tool body symbol | Hard coating layer (numbers in the bottom line indicate intended average layer thickness of the layer (μm)) | | | |
|---|---|---|---|---|---|
| | | Lower layer | | | |
| | | 1st layer | 2nd layer | 3rd layer | 4th layer |
| Coated tools of present invention, coated tools of Comparative Example, and coated tools of Reference Example | 16 α | — | — | — | — |
| | 17 ζ | — | — | — | — |
| | 18 β | — | — | — | — |
| | 19 η | TiC (0.5) | — | — | — |
| | 20 γ | TiN-1 (0.1) | — | — | — |
| | 21 θ | TiN-1 (0.5) | 1-TiCN-1 (12) | — | — |
| | 22 δ | TiN-1 (0.3) | 1-TiCN-1 (20) | TiN-2 (0.7) | — |
| | 23 ι | TiN-1 (0.3) | 1-TiCN-1 (4) | TiCN (0.4) | TiN-2 (0.3) |
| | 24 ε | — | — | — | — |
| | 25 κ | TiN-1 (0.5) | — | — | — |
| | 26 ζ | TiC (1) | — | — | — |
| | 27 α | TiN-1 (0.1) | — | — | — |
| | 28 η | TiN-1 (0.1) | — | — | — |
| | 29 β | — | — | — | — |
| | 30 θ | — | — | — | — |

TABLE 13

| Type | Cutting tool body symbol | Hard coating layer Complex carbonitride layer [$(Ti_{1-X}Al_X)(C_YN_{1-Y})$ layer] | | | | | | | |
|---|---|---|---|---|---|---|---|---|---|
| | | TiAlCN coating process formation symbol (refer Table 4) | Average layer thickness (μm) | Average Al content ratio X | Al content ratio $X_L$ | Al content ratio $X_H$ | Average C content ratio Y | Average grain diameter $D_L$ (μm) | Average grain diameter $D_H$ (μm) |
| Coated tools of the present invention | 16 α | A | 10 | 0.84 | 0.65 | 0.93 | 0.002 | 0.04 | 1.2 |
| | 17 ζ | B | 2 | 0.81 | 0.63 | 0.89 | 0.0005 | 0.06 | 1.8 |
| | 18 β | C | 20 | 0.86 | 0.67 | 0.9 | 0.005 | 0.04 | 0.8 |
| | 19 η | D | 5 | 0.81 | 0.7 | 0.95 | 0.0009 | 0.05 | 0.5 |
| | 20 γ | E | 14 | 0.88 | 0.68 | 0.92 | 0.0033 | 0.1 | 1.4 |
| | 21 θ | F | 7 | 0.88 | 0.63 | 0.92 | 0.0015 | 0.05 | 2 |
| | 22 δ | G | 4 | 0.79 | 0.58 | 0.84 | 0.0021 | 0.02 | 1.3 |
| | 23 ι | H | 16 | 0.81 | 0.63 | 0.91 | 0.004 | 0.06 | 0.8 |
| | 24 ε | I | 12 | 0.60 | 0.55 | 0.8 | 0.0012 | 0.07 | 1.4 |
| | 25 κ | J | 8 | 0.87 | 0.69 | 0.89 | 0.0035 | 0.07 | 1.1 |
| | 26 ζ | E | 14 | 0.90 | 0.68 | 0.92 | 0.0031 | 0.1 | 1.3 |
| | 27 α | D | 5 | 0.74 | 0.7 | 0.95 | 0.0007 | 0.05 | 0.5 |
| | 28 η | C | 20 | 0.86 | 0.68 | 0.9 | 0.0024 | 0.04 | 0.7 |
| | 29 β | B | 2 | 0.83 | 0.62 | 0.88 | 0.0031 | 0.05 | 1.8 |
| | 30 θ | A | 10 | 0.85 | 0.65 | 0.91 | 0.0027 | 0.05 | 1.2 |

TABLE 13-continued

| | | Hard coating layer | | | | | | | |
|---|---|---|---|---|---|---|---|---|---|
| | | Complex carbonitride layer [(Ti$_{1-X}$Al$_X$)(C$_Y$N$_{1-Y}$) layer] | | | | Upper layer (numbers in the bottom line indicate intended average layer thickness of the layer (μm)) | | | |
| Type | | Average chlorine content (atomic %) | Average chlorine content C$_L$ (atomic %) | Average chlorine content C$_H$ (atomic %) | Remarks | 1st layer | 2nd layer | 3rd layer | 4th layer |
| Coated tools of the present invention | 16 | 0.02 | 0.05 | 0.009 | Cubic crystal | — | — | — | — |
| | 17 | 0.4 | 0.5 | 0.01 | Cubic crystal | — | — | — | — |
| | 18 | 0.009 | 0.02 | 0.005 | Cubic crystal | — | — | — | — |
| | 19 | 0.3 | 0.9 | 0.001 | Cubic crystal | — | — | — | — |
| | 20 | 0.1 | 0.2 | 0.005 | Cubic crystal | — | — | — | — |
| | 21 | 0.05 | 0.6 | 0.004 | Cubic crystal | — | — | — | — |
| | 22 | 0.9 | 1 | 0.01 | Cubic crystal | — | — | — | — |
| | 23 | 0.004 | 0.6 | 0.001 | Cubic crystal | — | — | — | — |
| | 24 | 1.1 | 1.2 | 0.02 | Cubic crystal | Al$_2$O$_3$ (11) | — | — | — |
| | 25 | 0.005 | 0.05 | 0.008 | Cubic crystal | TiCN (0.5) | Al$_2$O$_3$ (25) | — | — |
| | 26 | 0.1 | 0.2 | 0.005 | Cubic crystal | TiCO (1) | Al$_2$O$_3$ (2) | — | — |
| | 27 | 0.3 | 0.9 | 0.001 | Cubic crystal | TiCNO (0.3) | Al$_2$O$_3$ (1) | — | — |
| | 28 | 0.009 | 0.04 | 0.005 | Cubic crystal | TiN-2 (0.3) | TiCN (0.8) | TiCNO (0.3) | Al$_2$O$_3$ (5) |
| | 29 | 0.4 | 0.5 | 0.01 | Cubic crystal | — | — | — | — |
| | 30 | 0.02 | 0.06 | 0.008 | Cubic crystal | — | — | — | — |

TABLE 14

| Type | | Cutting tool body symbol | TiAlCN coating process formation symbol (refer Table 4) | Hard coating layer | | | | | | | | | | Upper layer (numbers in the bottom line indicate intended average layer thickness of the layer (μm)) | | | |
|---|---|---|---|---|---|---|---|---|---|---|---|---|---|---|---|---|---|
| | | | | Complex carbonitride layer [(Ti$_{1-x}$Al$_x$)(C$_y$N$_{1-y}$)]layer | | | | | | | | | | | | | |
| | | | | Average layer thickness (μm) | Average Al content ratio X | Al content ratio X$_L$ | Al content ratio X$_H$ | Average C content ratio Y | Average grain diameter D$_L$ (μm) | Average grain diameter D$_H$ (μm) | Average chlorine content (atomic %) | Average chlorine content C$_L$ (atomic %) | Average chlorine content C$_H$ (atomic %) | Remarks | 1st layer | 2nd layer | 3rd layer | 4th layer |
| Coated tools of Comparative Example | 16 | α | a | 10 | 0.61 | 0.55 | *0.56 | *0.0001 | 0.05 | *0.1 | 0.07 | 0.06 | 0.05 | Cubic crystal | — | — | — | — |
| | 17 | ζ | b | 2 | 0.61 | 0.61 | *0.60 | *0.0002 | 0.06 | *0.12 | 0.6 | 0.6 | 0.6 | Cubic crystal | — | — | — | — |
| | 18 | β | c | 20 | 0.60 | 0.58 | *0.6 | *0.0002 | 0.04 | *0.21 | 0.03 | 0.02 | 0.02 | Cubic crystal | — | — | — | — |
| | 19 | η | d | 5 | 0.66 | 0.65 | *0.67 | *0.0001 | 0.05 | *0.08 | 0.7 | 0.9 | 0.8 | Cubic crystal | — | — | — | — |
| | 20 | γ | e | 14 | 0.66 | 0.64 | *0.66 | *0.0001 | 0.07 | *0.15 | 0.4 | 0.3 | 0.2 | Cubic crystal | — | — | — | — |
| | 21 | θ | f | 7 | 0.60 | 0.59 | *0.62 | *0.0002 | 0.05 | *0.12 | 0.6 | 0.7 | 0.6 | Cubic crystal | — | — | — | — |
| | 22 | δ | g | 4 | 0.62 | 0.56 | *0.58 | *0.0001 | 0.04 | *0.13 | 1 | 1 | 0.9 | Cubic crystal | — | — | — | — |
| | 23 | ι | h | 16 | 0.63 | 0.62 | *0.64 | *0.0002 | 0.06 | *0.18 | 0.4 | 0.5 | 0.4 | Cubic crystal | Al$_2$O$_3$ (11) | — | — | — |
| | 24 | ε | e | 12 | 0.66 | 0.64 | *0.66 | *0.0001 | 0.07 | *0.15 | 0.3 | 0.3 | 0.2 | Cubic crystal | TiCN (0.5) | Al$_2$O$_3$ (25) | — | — |
| | 25 | κ | d | 8 | 0.66 | 0.65 | *0.67 | *0.0001 | 0.05 | *0.08 | 0.8 | 0.9 | 0.8 | Cubic crystal | TiCO (1) | Al$_2$O$_3$ (2) | — | — |
| | 26 | ζ | c | 14 | 0.60 | 0.58 | *0.6 | *0.0002 | 0.04 | *0.21 | 0.03 | 0.02 | 0.02 | Cubic crystal | TiCNO (0.3) | Al$_2$O$_3$ (1) | — | — |
| | 27 | α | b | 5 | 0.61 | 0.61 | *0.60 | *0.0002 | 0.06 | *0.12 | 0.7 | 0.6 | 0.6 | Cubic crystal | TiN-2 (0.3) | TiCN (0.8) | TiCNO (0.3) | Al$_2$O$_3$ (5) |
| | 28 | η | a | 20 | 0.61 | 0.55 | *0.56 | *0.0001 | 0.05 | *0.1 | 0.05 | 0.06 | 0.05 | Cubic crystal | — | — | — | — |
| Coated tools of Reference Example | 29 | β | AIP | 2 | 0.81 | *0.8 | 0.81 | *0 | 0.05 | *0.22 | 0 | 0 | 0 | *Hexagonal crystal | — | — | — | — |
| | 30 | θ | AIP | 10 | 0.83 | *0.85 | 0.84 | *0 | 0.06 | *0.24 | 0 | 0 | 0 | *Hexagonal crystal | — | — | — | — |

Note 1:
"AIP" means coating by arc ion plating.
Note 2:
*mark in the table indicates the parameter is out of the ranges in the scope of the present invention.

Next, each coated tool described above was screwed on the tip of the insert holder made of tool steel by a fixing jig. Then, the dry high speed intermittent cutting test of carbon steel and the wet high speed intermittent cutting test of cast iron explained below were performed on the coated tools of the present invention 16-30; the coated tools of Comparative Example 16-28; and the coated tools of Reference Example 29-30. After the tests, width of flank wear of the cutting edge was measured.

Cutting Condition 2:
Work: Round bar in JIS-SCM435 standard with 4 evenly spaced slits in the longitudinal direction
Cutting speed: 350 m/min.
Cutting depth: 1.2 mm
Feed rate: 0.2 mm/rev.
Cutting time: 5 minutes (the usual cutting speed is 220 m/min)

Cutting Condition 3:
Work: Round bar in JIS-FCD450 standard with 4 evenly spaced slits in the longitudinal direction
Cutting speed: 340 m/min.
Cutting depth: 1.0 mm
Feed rate: 0.2 mm/rev.
Cutting time: 5 minutes (the usual cutting speed is 200 m/min)

The results of the cutting test are shown in Table 15.

sition of: 8 mass % of Co; and the WC balance, and the dimension of: diameter of 50 mm; and thickness of 2 mm. They were inserted into a standard ultra-high pressure sintering apparatus in the stacked state. Then, they were subjected to ultra-high-pressure sintering in the standard condition of: 4 GPa of pressure; a predetermined temperature within the range of 1200-1400° C.; and 0.8 hour of the retention time. Then, the top and bottom surfaces of the sintered bodies were grinded by using a diamond grind tool. Then, they were divided into a predetermined dimension with a wire-electrical discharge machine. Then, they were brazed on the brazing portion (corner portion) of the insert main body made of WC-based cemented carbide alloy, which had the composition of: 5 mass % of Co; 5 mass % of TaC; and the WC balance, and the shape defined by ISO CNGA120412 standard (the diamond shape of: thickness of 4.76 mm; and inscribed circle diameter of 12.7 mm) by using the brazing material made of Ti—Zr—Cu alloy having composition made of: 37.5% of Zr; 25% of Cu; and the Ti balance in volume %. Then, after performing outer peripheral machining into a predetermined dimension, the cutting edges of the brazed parts were subjected to a honing work of: width of 0.13 mm; and angle of 25°. Then, by performing the final polishing on them, the cutting tool bodies B1-B4 with the insert shape defined by ISO CNGA120412 standard were produced.

TABLE 15

| Type | | Width of flank wear (mm) | | Type | | Cutting test result (min) | |
|---|---|---|---|---|---|---|---|
| | | Cutting condition 2 | Cutting condition 3 | | | Cutting condition 2 | Cutting condition 3 |
| Coated tools of the present invention | 16 | 0.22 | 0.24 | Coated tools of Comparative Example | 16 | 4.3* | 4.3* |
| | 17 | 0.22 | 0.25 | | 17 | 3.3* | 3.3* |
| | 18 | 0.23 | 0.26 | | 18 | 4.7* | 4.7* |
| | 19 | 0.21 | 0.23 | | 19 | 3.3* | 3.3* |
| | 20 | 0.15 | 0.18 | | 20 | 4.8* | 4.8* |
| | 21 | 0.20 | 0.22 | | 21 | 3.8* | 3.8* |
| | 22 | 0.20 | 0.22 | | 22 | 4.2* | 4.2* |
| | 23 | 0.23 | 0.25 | | 23 | 3.9* | 3.9* |
| | 24 | 0.23 | 0.19 | | 24 | 3.3* | 3.3* |
| | 25 | 0.21 | 0.23 | | 25 | 4.8* | 4.8* |
| | 26 | 0.19 | 0.22 | | 26 | 3.8* | 3.8* |
| | 27 | 0.14 | 0.13 | | 27 | 4.2* | 4.2* |
| | 28 | 0.16 | 0.13 | | 28 | 2.3* | 2.3* |
| | 29 | 0.22 | 0.24 | Coated tools of Reference Example | 29 | 2.3* | 2.3* |
| | 30 | 0.19 | 0.20 | | 30 | 2.1* | 2.1* |

The * mark in the column of coated tools of Comparative Example and Reference Example indicates the cutting time (min) until reaching to its service life because of occurrence of chipping.

Example 3

As raw material powders, the cBN powder, the TiN powder, the TiCN powder, the TiC powder, the Al powder, and $Al_2O_3$ powder, all of which had the average grain sizes of 0.5-4 μm, were prepared. These raw material powders were blended in the blending composition shown in Table 16. Then, the mixtures were wet-mixed for 80 hours with a ball mill. After drying, the mixtures were press-molded into green compacts with a dimension of: diameter of 50 mm; and thickness of 1.5 mm, under pressure of 120 MPa. Then, the obtained green compacts were sintered in vacuum in the condition of 1 Pa vacuum at the predetermined temperature in the range of 900-1300° C. for 60 minutes retention to obtain preliminary sintered bodies for the cutting edge pieces. The obtained preliminary sintered bodies were placed on separately prepared supporting pieces made of WC-based cemented carbide alloy, which had the compo-

TABLE 16

| | | Blending composition (mass %) | | | | | |
|---|---|---|---|---|---|---|---|
| Type | | TiN | TiCN | TiC | Al | $Al_2O_3$ | cBN |
| Cutting tool body | B1 | 30 | 20 | — | 12 | — | Balance |
| | B2 | — | 35 | 5 | 8 | 2 | Balance |
| | B3 | 15 | — | 30 | 6 | 5 | Balance |
| | B4 | — | — | 25 | 6 | 4 | Balance |

Next, the coated-cutting tools of the present invention 31-40 indicated in Tables 17 and 18 were produced by vapor depositing the $(Ti_{1-X}Al_X)(C_YN_{1-Y})$ layer of the cutting tool related to the present invention on the surfaces of the cutting tool bodies B1-B4 in intended thicknesses using a standard chemical vapor deposition apparatus in the conditions indicated in Tables 3 and 4.

For the coated-cutting tools of the present invention 34-38, the lower layer and/or the upper layer were formed in the coating conditions indicted in Table 3.

For comparison purposes, the coated-cutting tools of Comparative Examples 31-38 indicated in Tables 17 and 19 were produced by vapor depositing $(Ti_{1-X}Al_X)(C_YN_{1-Y})$ of Comparative Example on the surface of the cutting tool bodies B1-B4 in intended thicknesses using a standard chemical vapor deposition apparatus in the conditions indicated in Table 4 in the same manner.

Similarly to the coated-cutting tools of the present invention 34-38, for the coated-cutting tools of Comparative Examples 34-38, the lower layer and/or the upper layer were formed in the coating conditions indicted in Table 3.

For reference, the coated-cutting tools of Reference Example 39 and 40 indicated in Tables 17 and 19 were produced by vapor depositing $(Ti_{1-X}Al_X)(C_YN_{1-Y})$ layer of Reference Example on the surface of the cutting tool bodies B1 and B2 in intended thicknesses using a conventional physical vapor deposition apparatus by arc-ion plating.

The condition for the arc-ion plating was the same as described in Example 1. By vapor depositing $(Ti_{1-X}Al_X)(C_YN_{1-Y})$ layer on the surfaces of the above-mentioned cutting tool bodies in the intended average compositions and layer thicknesses indicated in Table 19 in the arc-ion plating, the coated tools of Reference Example 39 and 40 were produced.

Next, in regard to the hard coating layers of the above-described coated tools of the present invention 31-40, the average layer thickness of each layer of the hard coating layer; the average Al content ratio X of the complex carbonitride layer; the average C content ratio Y; the Al content ratios $X_L$ and $X_H$; the average grain sizes $D_L$ and $D_H$; the average chlorine content; the average chlorine content $C_L$; the average chlorine content $C_H$; and the crystal structure of the complex carbonitride layer were measured by using the same methods as the methods described in Example 1.

Results were indicated in Table 18.

Next, in regard to each of the coated tools of Comparative Examples 31-38 and the coated tools of Reference Examples 39-40, the average layer thickness of each layer of the hard coating layer; the average Al content ratio x of the complex carbonitride layer; the average C content ratio y; the Al content ratios $x_L$ and $x_H$; the average grain sizes $d_L$ and $d_H$; the average chlorine content; the average chlorine content $c_L$; the average chlorine content $c_H$; and the crystal structure of the complex carbonitride layer were measured, in the same manner as the coated tools of the present invention 31-40.

The results were shown in Table 19.

TABLE 17

| Type | Cutting tool body symbol | Hard coating layer (numbers in the bottom line indicate intended average layer thickness of the layer (μm)) | | |
|---|---|---|---|---|
| | | Lower layer | | |
| | | 1st layer | 2nd layer | 3rd layer |
| Coated tools of present invention, coated tools of Comparative Example, and coated tools of Reference Example | 31 | B1 | — | — | — |
| | 32 | B2 | — | — | — |
| | 33 | B3 | — | — | — |
| | 34 | B4 | TiC (0.5) | — | — |
| | 35 | B1 | TiN-3 (0.5) | — | — |
| | 36 | B2 | TiN-3 (0.1) | — | — |
| | 37 | B3 | TiN-3 (0.5) | 1-TiCN-2 (3) | — |
| | 38 | B4 | TiN-3 (0.3) | 1-TiCN-2 (7) | TiN-3 (0.7) |
| | 39 | B1 | — | — | — |
| | 40 | B2 | — | — | — |

TABLE 18

| | | Cutting tool body symbol | TiAlCN coating process formation symbol (refer Table 4) | Complex carbonitride layer [$(Ti_{1-X}Al_X)(C_YN_{1-Y})$ layer] | | | | | | | | | | | Upper layer (numbers in the bottom line indicate intended average layer thickness of the layer (μm)) |
|---|---|---|---|---|---|---|---|---|---|---|---|---|---|---|---|
| Type | | | | Average layer thickness (μm) | Average Al content ratio X | Al content ratio $X_L$ | Al content ratio $X_H$ | Average C content ratio Y | Average grain diameter $D_L$ (μm) | Average grain diameter $D_H$ (μm) | Average chlorine content (atomic %) | Average chlorine content $C_L$ (atomic %) | Average chlorine content $C_H$ (atomic %) | Remarks | |
| Coated tools of the present invention | 31 | B1 | A | 10 | 0.83 | 0.62 | 0.91 | 0.0021 | 0.06 | 1.4 | 0.02 | 0.05 | 0.006 | Cubic crystal | — |
| | 32 | B2 | F | 7 | 0.85 | 0.59 | 0.88 | 0.0013 | 0.03 | 1.9 | 0.04 | 0.7 | 0.004 | Cubic crystal | — |
| | 33 | B3 | C | 11 | 0.88 | 0.71 | 0.91 | 0.006 | 0.05 | 0.7 | 0.009 | 0.02 | 0.003 | Cubic crystal | — |
| | 34 | B4 | D | 5 | 0.90 | 0.68 | 0.94 | 0.0009 | 0.03 | 0.5 | 0.3 | 0.9 | 0.001 | Cubic crystal | — |
| | 35 | B1 | G | 2 | 0.77 | 0.58 | 0.87 | 0.0029 | 0.02 | 1.1 | 0.9 | 1 | 0.01 | Cubic crystal | TiN-3 (0.5) |

TABLE 18-continued

Hard coating layer

Complex carbonitride layer [(Ti$_{1-X}$Al$_X$)(C$_Y$N$_{1-Y}$) layer]

| Type | Cutting tool body symbol | TiAlCN coating process formation symbol (refer Table 4) | Average layer thickness (μm) | Average Al content ratio X | Al content ratio X$_L$ | Al content ratio X$_H$ | Average C content ratio Y | Average grain diameter D$_L$ (μm) | Average grain diameter D$_H$ (μm) | Average chlorine content (atomic %) | Average chlorine content C$_L$ (atomic %) | Average chlorine content C$_H$ (atomic %) | Remarks | Upper layer (numbers in the bottom line indicate intended average layer thickness of the layer (μm)) |
|---|---|---|---|---|---|---|---|---|---|---|---|---|---|---|
| 36 | B2 | A | 10 | 0.82 | 0.61 | 0.92 | 0.0018 | 0.06 | 1.4 | 0.02 | 0.05 | 0.005 | Cubic crystal | — |
| 37 | B3 | F | 7 | 0.86 | 0.59 | 0.89 | 0.0017 | 0.04 | 1.8 | 0.04 | 0.7 | 0.004 | Cubic crystal | — |
| 38 | B4 | C | 12 | 0.88 | 0.71 | 0.9 | 0.0042 | 0.06 | 0.7 | 0.008 | 0.02 | 0.003 | Cubic crystal | — |
| 39 | B1 | D | 5 | 0.89 | 0.68 | 0.91 | 0.0008 | 0.04 | 0.6 | 0.3 | 0.9 | 0.001 | Cubic crystal | — |
| 40 | B2 | G | 2 | 0.75 | 0.59 | 0.85 | 0.0022 | 0.02 | 1.2 | 0.9 | 1 | 0.01 | Cubic crystal | — |

TABLE 19

Hard coating layer

Complex carbonitride layer [(Ti$_{1-X}$Al$_X$)(C$_Y$N$_{1-Y}$) layer]

| | Type | Cutting tool body symbol | TiAlCN coating process formation symbol (refer Table 4) | Average layer thickness (μm) | Average Al content ratio X | Al content ratio X$_L$ | Al content ratio X$_H$ | Average C content ratio Y | Average grain diameter D$_L$ (μm) | Average grain diameter D$_H$ (μm) | Average chlorine content (atomic %) | Average chlorine content C$_L$ (atomic %) | Average chlorine content C$_H$ (atomic %) | Remarks | Upper layer (numbers in the bottom line indicate intended average layer thickness of the layer (μm)) |
|---|---|---|---|---|---|---|---|---|---|---|---|---|---|---|---|
| Coated tools of Comparative Example | 31 | B1 | a | 10 | 0.65 | 0.66 | *0.65 | *0.0001 | 0.05 | *0.17 | 0.06 | 0.06 | 0.05 | Cubic crystal | — |
| | 32 | B2 | f | 7 | 0.63 | 0.63 | *0.63 | *0.0002 | 0.05 | *0.12 | 0.7 | 0.7 | 0.6 | Cubic crystal | — |
| | 33 | B3 | c | 20 | 0.7 | 0.65 | *0.7 | *0.0002 | 0.04 | *0.21 | 0.02 | 0.03 | 0.02 | Cubic crystal | — |
| | 34 | B4 | d | 5 | 0.61 | 0.55 | *0.55 | *0.0001 | 0.05 | *0.08 | 0.9 | 1 | 0.7 | Cubic crystal | — |
| | 35 | B1 | a | 10 | 0.65 | 0.64 | *0.65 | *0.0001 | 0.05 | *0.13 | 0.06 | 0.06 | 0.05 | Cubic crystal | TiN-3 (0.5) |
| | 36 | B2 | f | 7 | 0.63 | 0.65 | *0.63 | *0.0002 | 0.05 | *0.12 | 0.7 | 0.7 | 0.6 | Cubic crystal | — |
| | 37 | B3 | c | 20 | 0.7 | 0.69 | *0.7 | *0.0001 | 0.05 | *0.19 | 0.02 | 0.03 | 0.02 | Cubic crystal | — |
| | 38 | B4 | d | 5 | 0.62 | 0.56 | *0.55 | *0.0001 | 0.05 | *0.09 | 0.8 | 0.9 | 0.6 | Cubic crystal | — |
| Coated tools of Reference Example | 39 | B1 | AIP | 5 | 0.8 | *0.8 | 0.81 | *0 | 0.05 | *0.21 | 0 | 0 | 0 | *Hexagonal crystal | — |
| | 40 | B2 | AIP | 5 | 0.3 | *0.84 | 0.85 | *0 | 0.06 | *0.24 | 0 | 0 | 0 | *Hexagonal crystal | — |

Note 1:
"AIP" means coating by arc ion plating.
Note 2:
*mark in the table indicates the parameter is out of the ranges in the scope of the present invention.

Next, each coated tool described above was screwed on the tip of the insert holder made of tool steel by a fixing jig. Then, the dry high speed intermittent cutting test of carbolized steel explained below were performed on the coated tools of the present invention 31-40; the coated tools of Comparative Example 31-38; and the coated tools of Reference Example 39-40. After the tests, width of flank wear of the cutting edge was measured.

Work: Round bar in JIS-SCM415 standard (hardness: HRC62) with 4 evenly spaced slits in the longitudinal direction
Cutting speed: 200 m/min.
Cutting depth: 0.15 mm
Feed rate: 0.15 mm/rev.
Cutting time: 5 minutes
Results of the cutting test are shown in Table 20.

TABLE 20

| Type | | Width of flank wear (mm) | Type | | Cutting test result (min) |
|---|---|---|---|---|---|
| Coated tools of the present invention | 31 | 0.07 | Coated tools of Comparative Example | 31 | *2.6 |
| | 32 | 0.11 | | 32 | *2.3 |
| | 33 | 0.12 | | 33 | *1.7 |
| | 34 | 0.09 | | 34 | *2.4 |
| | 35 | 0.09 | | 35 | *2.6 |
| | 36 | 0.07 | | 36 | *2.3 |
| | 37 | 0.11 | | 37 | *1.7 |
| | 38 | 0.09 | | 38 | *2.4 |
| | 39 | 0.09 | Coated tools of Reference Example | 39 | *2.1 |
| | 40 | 0.10 | | 40 | *2.1 |

The * mark in the column of coated tools of Comparative Example and Reference Example indicates the cutting time (min) until reaching to its service life because of occurrence of chipping.

Based on the results shown in Tables 6-9, 12-15, and 17-20, it was demonstrated that the $(Ti_{1-X}Al_X)(C_YN_{1-Y})$ layers in the cubic crystal structure were vapor deposited in the coated tools of the present invention 1-40. Also, the $(Ti_{1-X}Al_X)(C_YN_{1-Y})$ layers had compositionally gradient structure in which the Al content ratio was gradually increased from the interface between the complex carbonitride layer and the body toward the outer surface side of the complex carbonitride layer. Also, the grain size distribution in which the average grain sizes were gradually increases was formed in the complex carbonitride layer. Also, the complex carbonitride layer had the compositionally gradient structure in which the average chlorine content was gradually reduced. By having the above-described configurations, the coated tools of the present invention 1-40 showed excellent adhesion strength, lubricity, chipping resistance, and wear resistance in the high speed milling cutting of alloy steel or the high speed intermittent cutting on the outer periphery of alloy steel.

Contrary to that, unusual tool failures such as chipping, fracturing, peeling, or the like occurred in each of the coated tools of Comparative Example 1-13, 16-28, and 31-38; and the coated tools of Reference Example 14, 15, 29, 30, 39, and 40. Moreover, it was clear that they reached to their service lives in a relatively short period of time.

INDUSTRIAL APPLICABILITY

As explained above, the coated tool of the present invention can be used not only for high-speed intermittent cutting work such as high-speed milling cutting work of the alloy steel or the like but as a coated tool for a variety of works to be cut. Furthermore, it exhibits an excellent wear resistance for a long-term use. Thus, it can be applicable to the cutting machine with high performance. It can be also applicable to satisfy the demands for labor-saving, energy-saving and reducing cost in the cutting work.

The invention claimed is:

1. A surface-coated cutting tool comprising:
a cutting tool body made of any one of cemented carbide including tungsten carbide, cermet including titanium carbonitride, and ultra-high pressure sintered material including cubic boron nitride; and
a hard coating layer coated on a surface of the cutting tool body, wherein
(a) the hard coating layer comprises at least a complex carbonitride layer of Ti and Al with a cubic crystal structure, the complex carbonitride layer being vapor-deposited by a chemical vapor deposition method and having an average thickness of 1-20 μm,
(b) an Al content ratio X and a C content ratio Y satisfy $0.60 \leq X \leq 0.90$ and $0.0005\% \leq Y \leq 0.005$, respectively, in the complex carbonitride layer: an average composition of the complex carbonitride layer being expressed by a composition formula, $(Ti_{1-X}Al_X)(C_YN_{1-Y})$; and X and Y being in atomic ratio,
(c) an Al content ratio $X_L$ is $0.55 \leq X_L \leq 0.70$: a location L being a location 0.3 μm from an interface of the complex carbonitride layer on a side of the cutting tool body to an internal part of the complex carbonitride layer; compositional analysis being performed on a cross-section, which includes the location L and is perpendicular to the surface of the cutting tool body, centering around the location L to obtain an Al content ratio of the complex carbonitride layer of Ti and Al with a cubic crystal structure; and the Al content ratio $X_L$ being calculated as an average value of the obtained Al content ratio by the compositional analysis in atomic ratio;
an Al content ratio $X_H$ is $0.8 \leq X_H \leq 0.95$: a location H being a location 0.3 μm from an interface of the complex carbonitride layer on an outer surface side of the complex carbonitride layer to the internal part of the complex carbonitride layer; compositional analysis being performed on a cross-section, which includes the location H and is perpendicular to the surface of the cutting tool body, centering around the location H to obtain an Al content ratio of the complex carbonitride layer of Ti and Al with a cubic crystal structure; and the Al content ratio $X_H$ being calculated as an average value of the obtained Al content ratio by the compositional analysis in atomic ratio; and
the complex carbonitride layer has a compositionally gradient structure in which the Al content ratio in the complex carbonitride layer gradually increases from the interface of the complex carbonitride layer on the side of the cutting tool body to the outer surface side of the complex carbonitride layer, and
(d) an average grain size $D_L$, which is an average value of crystal grain width of the complex carbonitride in a cross-section including the location L and being parallel to the surface of the cutting tool body, is 0.1 μm or less;
an average grain size $D_H$, which is an average value of crystal grain width of the complex carbonitride in a cross-section including the location H and being parallel to the surface of the cutting tool body, is 0.5 μm to 2 μm; and an average grain size of the complex carbonitride layer of Ti and Al with the cubic crystal structure forms a grain size distribution gradually increasing from the interface of the complex carbonitride layer on the side of the cutting tool body to the outer surface side of the complex nitride layer.

2. The surface-coated cutting tool according to claim 1, wherein the complex carbonitride layer includes chlorine in an average chlorine content of 0.001-1.0 atomic %.

3. The surface-coated cutting tool according to claim 2, wherein an average chlorine content $C_L$ is 0.02-1.0 atomic %,
compositional analysis being performed on the cross-section, which includes the location L and is perpendicular to the surface of the cutting tool body, centering around the location L to obtain a chlorine content, and
the chlorine content $C_L$ being calculated as an average value of the obtained chlorine content by the compositional analysis, an average chlorine content $C_H$ is 0.001-0.01 atomic %,
compositional analysis being performed on the cross-section, which includes the location H and is perpendicular to the surface of the cutting tool body, centering around the location H to obtain a chlorine content, and
the chlorine content $C_H$ being calculated as an average value of the obtained chlorine content by the compositional analysis, and the complex carbonitride layer has a compositionally gradient structure in which an average chlorine content in the complex carbonitride layer gradually decreases from the interface of the complex carbonitride layer on the side of the cutting tool body to the outer surface side of the complex carbonitride layer.

4. The surface-coated cutting tool according to any one of claims 1 to 3, further comprising:

a Ti compound layer formed between the cutting tool body and the complex carbonitride layer of Ti and Al, wherein the Ti compound layer is made of at least one layer selected from the group consisting of a titanium carbide layer, a titanium nitride layer, a titanium carbonitride layer, a titanium carbonate layer and a titanium oxycarbonitride layer; and an average total thickness of the Ti compound layer being 0.1-20 μm.

5. The surface-coated cutting tool according to any one of claims 1 to 3, wherein the hard coating layer further comprises an aluminum oxide layer with an average layer thickness of 1-25 μm.

6. The surface-coated cutting tool according to claim 4, wherein the hard coating layer further comprises an aluminum oxide layer with an average layer thickness of 1-25 μm.

7. The surface-coated cutting tool according to claim 5, wherein the aluminum oxide layer is formed on the complex carbonitride layer.

8. The surface-coated cutting tool according to claim 6, wherein the aluminum oxide layer is formed on the complex carbonitride layer.

9. The surface-coated cutting tool according to claim 5, wherein the Ti compound layer is formed on the cutting tool body, the complex carbonitride layer is formed on the Ti compound layer, the aluminum oxide layer is formed on the complex carbonitride layer, and the aluminum oxide layer is an outermost layer of the surface-coated cutting tool.

10. The surface-coated cutting tool according to claim 6, wherein the Ti compound layer is formed on the cutting tool body, the complex carbonitride layer is formed on the Ti compound layer, the aluminum oxide layer is formed on the complex carbonitride layer, and the aluminum oxide layer is an outermost layer of the surface-coated cutting tool.

11. The surface-coated cutting tool according to any one of claims 1 to 3, wherein the complex carbonitride layer is vapor-deposited by a chemical vapor deposition method in which at least trimethylaluminum is used as a reaction gas component.

12. The surface-coated cutting tool according to claim 4, wherein the complex carbonitride layer is vapor-deposited by a chemical vapor deposition method in which at least trimethylaluminum is used as a reaction gas component.

* * * * *